US012652886B2

(12) United States Patent
Choi et al.

(10) Patent No.: US 12,652,886 B2
(45) Date of Patent: Jun. 9, 2026

(54) LIGHT EMITTING ELEMENT, MANUFACTURING METHOD OF LIGHT EMITTING ELEMENT, AND DISPLAY DEVICE

(71) Applicant: Samsung Display Co., LTD., Yongin-si (KR)

(72) Inventors: Byeong Kyun Choi, Yongin-si (KR); Jong Moo Huh, Yongin-si (KR); Byoung Yong Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 681 days.

(21) Appl. No.: 17/977,033

(22) Filed: Oct. 31, 2022

(65) Prior Publication Data

US 2023/0317881 A1 Oct. 5, 2023

(30) Foreign Application Priority Data

Mar. 30, 2022 (KR) ........................ 10-2022-0039818

(51) Int. Cl.
| | |
|---|---|
| *H10H 20/81* | (2025.01) |
| *G09F 9/302* | (2006.01) |
| *H10H 20/01* | (2025.01) |
| *H10H 20/831* | (2025.01) |

(Continued)

(52) U.S. Cl.
CPC ....... *H10H 20/8215* (2025.01); *G09F 9/3026* (2013.01); *H10H 20/01* (2025.01); *H10H 20/8312* (2025.01); *H10H 20/857* (2025.01); *H10H 29/142* (2025.01); *H10H 20/032* (2025.01); *H10H 20/0364* (2025.01)

(58) Field of Classification Search
CPC .. H10H 20/8312; H10H 20/01; H10H 20/857; H10H 29/142; H10H 20/032; H10H 20/0364; H10H 20/018; H10H 20/812; H10H 20/815; H10H 20/82; H10H 20/01335; H10H 20/8215; H10H 20/819; H10H 20/83; H01L 25/167; H01L 25/0753
See application file for complete search history.

(56) References Cited

U.S. PATENT DOCUMENTS

| | | | | |
|---|---|---|---|---|
| 6,015,979 A | * | 1/2000 | Sugiura | ............ H10H 20/01335 257/86 |
| 6,069,394 A | * | 5/2000 | Hashimoto | ............. C30B 25/18 257/466 |
| 9,024,349 B2 | | 5/2015 | Chitnis et al. | |

(Continued)

FOREIGN PATENT DOCUMENTS

| | | | | |
|---|---|---|---|---|
| CN | 108598225 A | * | 9/2018 | ............. B82Y 40/00 |
| GB | 2483689 A | * | 3/2012 | ............. H10H 20/01 |

(Continued)

OTHER PUBLICATIONS

Machine Translation, Kang et al., KR 20120136703 A (Year: 2012).*

*Primary Examiner* — Scott B Geyer
(74) *Attorney, Agent, or Firm* — CANTOR COLBURN LLP

(57) ABSTRACT

A light emitting element includes an n-type semiconductor, a p-type semiconductor, and an active layer between the n-type semiconductor and the p-type semiconductor, threading dislocations are formed in the n-type semiconductor, and openings are formed on a surface of the n-type semiconductor based on the threading dislocations.

10 Claims, 13 Drawing Sheets

(51) Int. Cl.
H10H 20/857 (2025.01)
H10H 29/14 (2025.01)

(56) References Cited

U.S. PATENT DOCUMENTS

| 9,620,670 B2 * | 4/2017 | Basceri ................. H10H 20/813 |
| 10,245,337 B2 | 4/2019 | Park et al. |
| 2009/0134406 A1 * | 5/2009 | Chen ................... H10H 20/8215 |
| | | 257/79 |
| 2011/0018010 A1 * | 1/2011 | Ueno ................ H01L 21/02395 |
| | | 257/E33.034 |
| 2012/0068196 A1 * | 3/2012 | Smeeton .............. H10H 20/819 |
| | | 257/E33.012 |
| 2012/0119254 A1 * | 5/2012 | Moon .................... H10H 20/82 |
| | | 257/101 |
| 2012/0187444 A1 * | 7/2012 | Oh .................... H01L 21/02502 |
| | | 438/22 |
| 2012/0205616 A1 * | 8/2012 | Zhang .............. H01L 21/02458 |
| | | 977/773 |
| 2012/0313138 A1 * | 12/2012 | Peter ................ H10H 20/01335 |
| | | 257/101 |
| 2013/0037779 A1 * | 2/2013 | Takeoka ............. H10H 20/8215 |
| | | 438/36 |
| 2013/0037841 A1 * | 2/2013 | Choi .................... H10H 20/819 |
| | | 257/E33.074 |
| 2013/0256650 A1 * | 10/2013 | Yang .................. H10H 20/8215 |
| | | 257/77 |
| 2014/0154828 A1 * | 6/2014 | Mukono .......... H10H 20/01335 |
| | | 438/46 |
| 2014/0332833 A1 * | 11/2014 | Kim .................. H01L 21/02381 |
| | | 257/190 |
| 2014/0370634 A1 * | 12/2014 | Lee .................... H10H 20/0137 |
| | | 438/46 |
| 2015/0041758 A1 * | 2/2015 | Saito .................... H10H 20/825 |
| | | 257/13 |
| 2015/0083993 A1 * | 3/2015 | Nagata ................ H10H 20/812 |
| | | 257/13 |
| 2015/0171263 A1 * | 6/2015 | Nakatsu .............. H10H 20/811 |
| | | 438/47 |
| 2015/0194442 A1 * | 7/2015 | Ishibashi .......... H01L 21/02436 |
| | | 428/137 |
| 2016/0380155 A1 * | 12/2016 | Jeong ................ H10H 20/8215 |
| | | 257/101 |
| 2019/0123237 A1 * | 4/2019 | Sakong ............ H10H 20/8215 |
| 2019/0348567 A1 * | 11/2019 | Na ..................... H10H 20/8215 |
| 2020/0035858 A1 * | 1/2020 | Galler ................... H10H 20/82 |
| 2020/0365765 A1 * | 11/2020 | Chen .................. H10H 20/815 |
| 2021/0399167 A1 * | 12/2021 | Baek ....................... G09G 3/32 |
| 2022/0131034 A1 * | 4/2022 | Gomez-Iglesias .... H10F 77/146 |
| 2022/0320374 A1 * | 10/2022 | Iguchi ............. H10H 20/01335 |
| 2023/0081464 A1 * | 3/2023 | Yoo .................... H10H 20/8215 |
| | | 257/94 |
| 2024/0387770 A1 * | 11/2024 | Baek .................... H10H 20/857 |
| 2024/0421255 A1 * | 12/2024 | Varghese ............ H10H 20/817 |

FOREIGN PATENT DOCUMENTS

| JP | 1997-172199 | | 6/1997 | |
| JP | 4438277 | | 3/2010 | |
| KR | 20120055356 A | * | 5/2012 | .......... H10H 20/825 |
| KR | 20120136703 A | * | 12/2012 | ........ H10H 20/8215 |
| KR | 10-1548022 | | 8/2015 | |
| KR | 20180103268 A | * | 9/2018 | ........ H01L 33/0008 |
| KR | 10-2025424 | | 9/2019 | |
| WO | WO-2016108423 A1 | * | 7/2016 | .......... H10H 20/812 |
| WO | WO-2022217541 A1 | * | 10/2022 | ............ H01L 21/20 |

* cited by examiner

FIG. 4

ACT: TCH, TS, TD
GTL1: TG, CAE1
GTL2: CAE2
DTL1: CE1
DTL2: CE2, VSL

PX3    PAD    BB

DR2
DR3 ⊙ → DR1

LIGHT EMITTING ELEMENT, MANUFACTURING METHOD OF LIGHT EMITTING ELEMENT, AND DISPLAY DEVICE

CROSS-REFERENCE TO RELATED APPLICATION(S)

This application claims priority to and benefits of Korean Patent Application No. 10-2022-0039818 under 35 U.S.C. § 119, filed on Mar. 30, 2022, in the Korean Intellectual Property Office (KIPO), the entire contents of which are incorporated herein by reference.

BACKGROUND

1. Technical Field

The disclosure relates to a light emitting element, a manufacturing method of the light emitting element, and a display device.

2. Description of the Related Art

Recently, as interest in information display is increasing, research and development on display devices are continuously made.

SUMMARY

Aspects of the disclosure is to provide a light emitting element, a manufacturing method of the light emitting element, and a display device having improved luminous efficiency.

According to an embodiment of the disclosure, a light emitting element is provided. The light emitting element includes an n-type semiconductor, p-type semiconductor, and an active layer between the n-type semiconductor and the p-type semiconductor, threading dislocations are formed in the n-type semiconductor, and openings are formed on a surface of the n-type semiconductor based on the threading dislocation.

According to an embodiment, the threading dislocations may extend toward a side of the n-type semiconductor on which the active layer is not disposed.

According to an embodiment, an end of at least one of the threading dislocations may be opened in the openings.

According to an embodiment, the threading dislocations may include a longest threading dislocation having a longest length with respect to a thickness direction of the n-type semiconductor, and a length of the longest threading dislocation may be less than a thickness of the n-type semiconductor.

According to an embodiment, the n-type semiconductor may include a concave area corresponding to the openings and a flat area not corresponding to the openings, and the concave area and the flat area may be randomly formed on the surface of the n-type semiconductor.

According to an embodiment, the openings may have a polygonal shape or a shape including a curved surface in a plan view.

According to an embodiment, the threading dislocations may be not included in the active layer and the p-type semiconductor.

According to an embodiment, at least a portion of light provided from the active layer may be emitted through the openings to prevent a decrease in an intensity of the light.

According to an embodiment, the light emitting element may further include a first contact electrode electrically connected to the p-type semiconductor and a second contact electrode electrically connected to the n-type semiconductor, and the n-type semiconductor may include a first base part and a second base part, the active layer, the p-type semiconductor, and the first contact electrode may be disposed on the first base part, and the second contact electrode may be disposed on the second base part.

According to an embodiment, the light emitting element may be a flip chip type micro LED.

According to an embodiment of the disclosure, a manufacturing method of a light emitting element may include performing an epitaxial growth process to form a buffer layer, a first base semiconductor layer, a base active layer, and a second base semiconductor layer on a stacked substrate; providing an n-type semiconductor, an active layer, and a p-type semiconductor sequentially stacked by patterning the first base semiconductor layer, the base active layer, and the second base semiconductor layer; and setting a cutting line on the n-type semiconductor and cutting the n-type semiconductor along the cutting line, wherein the performing of the epitaxial growth process includes forming threading dislocations in the buffer layer and the first base semiconductor layer, and the cutting line is defined at a position where a density of the threading dislocations in the n-type semiconductor is highest for each position with respect to a thickness direction of the n-type semiconductor.

According to an embodiment, the stacked substrate may include a glass substrate or a silicon substrate.

According to an embodiment, the forming of the threading dislocations in the buffer layer and the first base semiconductor layer may include forming the threading dislocations across the buffer layer and the first base semiconductor layer without forming the threading dislocations in the active layer and the second base semiconductor layer.

According to an embodiment, the threading dislocations may include a longest threading dislocation that is longest with respect to a thickness direction of the stacked substrate, and a length of the longest threading dislocation may be less than a sum of a thickness of the buffer layer and a thickness of the first base semiconductor layer.

According to an embodiment, the buffer layer may have a first thickness, the first base semiconductor layer may have a second thickness, the first thickness may be greater than or equal to about 80 nm and less than or equal to about 160 nm, and the second thickness may be greater than or equal to about 2 μm and less than or equal to about 7 μm.

According to an embodiment, the cutting of the n-type semiconductor may include forming a concave area and a flat area on a surface of the n-type semiconductor corresponding to the cutting line.

According to an embodiment, the cutting of the n-type semiconductor may include forming openings by opening a portion of the threading dislocations.

According to an embodiment of the disclosure, a display device may include a light emitting element disposed on a substrate and including an n-type semiconductor, a p-type semiconductor, and an active layer between the n-type semiconductor and the p-type semiconductor, wherein threading dislocations are formed in the n-type semiconductor, and openings are formed on a surface of the n-type semiconductor based on the threading dislocations.

According to an embodiment of the disclosure, a tile type display device may include display devices adjacent to each other and a joint connecting the display devices, wherein each of the display devices includes: a light emitting element disposed on a substrate and including an n-type semiconductor, a p-type semiconductor, and an active layer interposed between the n-type semiconductor and the p-type semiconductor, threading dislocations are formed in the n-type semiconductor, and openings are formed on a surface of the n-type semiconductor based on the threading dislocations.

According to an embodiment, the light emitting element may be a flip chip type micro LED.

According to an embodiment of the disclosure, a light emitting element having improved luminous efficiency, a manufacturing method of the light emitting element, and a display device may be provided.

BRIEF DESCRIPTION OF THE DRAWINGS

FIG. 4 is a schematic cross-sectional view illustrating an example of a display device taken along a line A-A' of FIG. 3.

FIG. 6 is a schematic enlarged layout diagram illustrating in detail an area AA of FIG. 5.

FIG. 8 is a schematic enlarged layout drawing illustrating in detail an area BB of FIG. 5.

DETAILED DESCRIPTION OF THE EMBODIMENTS

Figure 1:
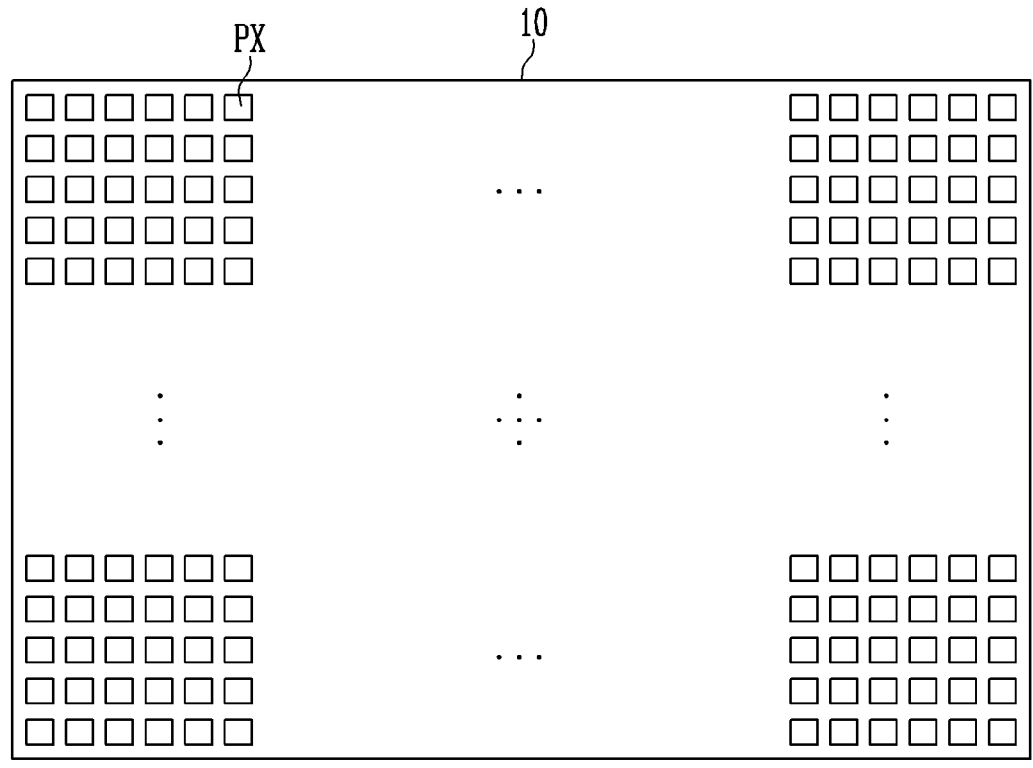
FIG. 1 is a schematic plan view illustrating a display device according to an embodiment.
Figure 1:
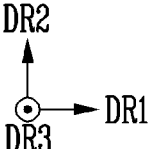

It will be apparent to those skilled in the art that various modifications and variations can be made in the disclosure without departing from the features or scope of the disclosure, and specific embodiments are described as an example in the drawings and explained in the detailed description. Thus, it is intended that the disclosure covers the modifications and variations of this disclosure provided they come within the scope of the disclosure and their equivalents.

The terms "first," "second" and the like may be simply used for description of various constituent elements, but those meanings may not be limited to the restricted meanings. The above terms are used for distinguishing a constituent element from another constituent elements. For example, a first constituent element may be referred to as a second constituent element and similarly, the second constituent element may be referred to as the first constituent element within the scope of the appended claims. When explaining the singular, unless explicitly described to the contrary, it may be interpreted as the plural meaning.

In the specification, the word "comprise," "include," or "has" is used to specify existence of a feature, a numbers, a process, an operation, a constituent element, a part, or a combination thereof, and it will be understood that existence or additional possibility of one or more other features or numbers, processes, operations, constituent elements, parts, or combinations thereof are not excluded in advance. In addition, it will be understood that when an element such as a layer, film, area, or substrate is referred to as being "on" another element, it can be directly on the other element or intervening elements may also be present. In the specification, it will be understood that when an element such as a layer, film, area, or substrate is referred to as being disposed "on" another element, the disposed direction is not limited to an upper direction and include a side direction or a lower direction. In contrast, it will be understood that when an element such as a layer, film, area, or substrate is referred to as being "beneath" another element, it can be directly beneath the other element or intervening elements may also be present.

The term "overlap" or "at least partially overlap" as used herein may mean that at least part of a first object faces at least part of a second object in a given direction or given view.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Spatially relative terms, such as "beneath," "below," "under," "lower," "above," "upper," "over," "higher," "side"

(e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, referring to the accompanying drawings, an embodiment of the disclosure will be described in further detail.

Figure 2:
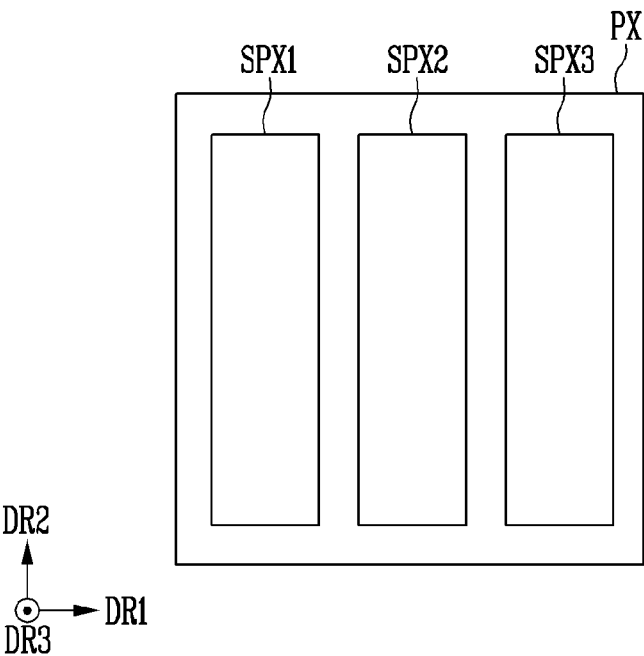
FIG. 2 is a schematic drawing illustrating an example of a pixel of FIG. 1.
Figure 3:
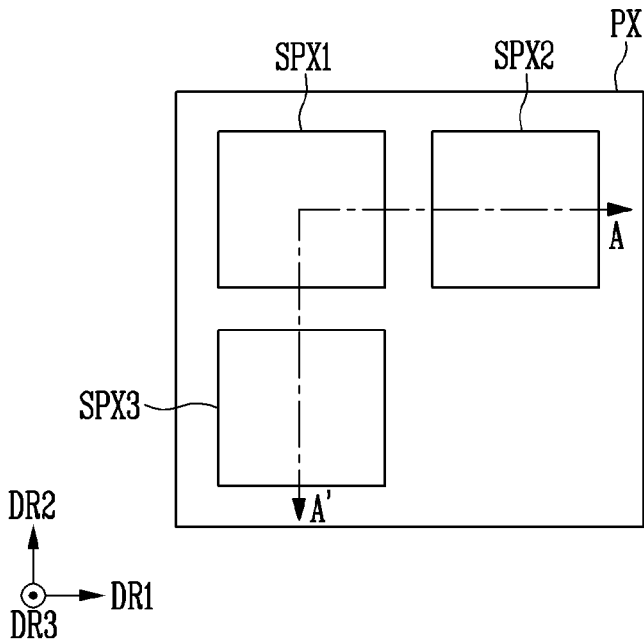
FIG. 3 is a schematic drawing illustrating another example of a pixel of FIG. 1.

FIG. 1 is a schematic plan view illustrating a display device according to an embodiment. FIG. 2 is a schematic drawing illustrating an example of a pixel of FIG. 1. FIG. 3 is a schematic drawing illustrating another example of a pixel of FIG. 1.

Referring to FIG. 1, a display device 10 may be a device for displaying a motion image or a still image, and may be used as a display screen of various products such as a television, a notebook, a monitor, a billboard, an internet of things (JOT) device, and the like, as well as a portable electronic device such as a mobile phone, a smart phone, a tablet personal computer (PC), a smart watch, a watch phone, a mobile communication terminal, an electron notebook, an electron book, a portable multimedia player (PMP), a navigation, an ultra-mobile pc (UMPC), and the like.

The display device 10 may be formed in a rectangular plane having a long side in a first direction DR1 and a short side in a second direction DR2 crossing the first direction DR1. A corner where the long side in the first direction DR1 and the short side in the second direction DR2 intersect may be formed to be round to have a curvature (e.g., a predetermined or selectable curvature) or may be formed to have a right angle. The planar shape of the display device 10 may be not limited to a quadrangle, and may be formed in other polygons, circles, or ovals. The display device 10 may be formed to be flat, but is not limited thereto. For example, the display device 10 may include curved portions formed at left and right ends and having a constant curvature or a varying curvature. The display device 10 may be flexibly formed to be curved, warped, bent, folded, or rolled.

The display device 10 may further include pixels PXs, scan lines extending in the first direction DR1, and data lines extending in the second direction DR2 to display an image.

The pixels PX may be arranged in a matrix form in the first direction DR1 and the second direction DR2.

Each of the pixels PX may include sub-pixels SPX1, SPX2, and SPX3 as shown in FIGS. 2 and 3. In FIGS. 2 and 3, it is illustrated that each of the pixels PX includes three sub-pixels SPX1, SPX2, and SPX3, for example, a first sub-pixel SPX1, a second sub-pixel SPX2, and a third sub-pixel SPX3, but embodiments of the disclosure are not limited thereto.

The first sub-pixel SPX1, the second sub-pixel SPX2, and the third sub-pixel SPX3 may be connected to at least one of the data lines and at least one of the scan lines.

Each of the first sub-pixel SPX1, the second sub-pixel SPX2, and the third sub-pixel SPX3 may have a planar shape of a rectangle, square, or rhombus. For example, each of the first sub-pixel SPX1, the second sub-pixel SPX2, and the third sub-pixel SPX3 may have a planar shape of a rectangle having the short side in the first direction DR1 and the long side in the second direction DR2 as shown in FIG. 2. In another example, each of the first sub-pixel SPX1, the second sub-pixel SPX2, and the third sub-pixel SPX3 may have a square or rhombus planar shape including sides having a same length in the first direction DR1 and the second direction DR2 as shown in FIG. 3.

As shown in FIG. 2, the first sub-pixel SPX1, the second sub-pixel SPX2, and the third sub-pixel SPX3 may be arranged in the first direction DR1. In another example, one of the second sub-pixel SPX2 and the third sub-pixel SPX3, and the first sub-pixel SPX1 may be arranged in the first direction DR1, and the other thereof and the first sub-pixel SPX1 may be arranged in the second direction DR2. For example, as shown in FIG. 3, the first sub-pixel SPX1 and the second sub-pixel SPX2 may be arranged in the first direction DR1, and the first sub-pixel SPX1 and the third sub-pixel SPX3 may be arranged in the second direction DR2.

In another example, one of the first sub-pixel SPX1 and the third sub-pixel SPX3, and the second sub-pixel SPX2 may be arranged in the first direction DR1, and the other thereof and the second sub-pixel SPX2 may be arranged in the second direction DR2. In another example, one of the first sub-pixel SPX1 and the second sub-pixel SPX2, and the third sub-pixel SPX3 may be arranged in the first direction DR1, and the other thereof and the third sub-pixel SPX3 may be arranged in the second direction DR2.

The first sub-pixel SPX1 may emit a first light, the second sub-pixel SPX2 may emit a second light, and the third sub-pixel SPX3 may emit a third light. Here, the first light may be light of a red wavelength band, the second light may be light of a green wavelength band, and the third light may be light of a blue wavelength band. The red wavelength band may be a wavelength band in a range of about 600 nm to about 750 nm, the green wavelength band may be a wavelength band in a range of about 480 nm to about 560 nm, and the blue wavelength band may be a wavelength band in a range of about 370 nm to about 460 nm, embodiments of the disclosure are not limited thereto.

Each of the first sub-pixel SPX1, the second sub-pixel SPX2, and the third sub-pixel SPX3 may include an inorganic light emitting element including an inorganic semiconductor as a light emitting element that emits light. For example, the inorganic light emitting element may be a flip chip type micro LED (Light Emitting Diode), but embodiments of the disclosure are not limited thereto.

An area of the first sub-pixel SPX1, an area of the second sub-pixel SPX2, and an area of the third sub-pixel SPX3 may be substantially the same as shown in FIGS. 2 and 3, but embodiments of the disclosure are not limited thereto. At least one of the area of the first sub-pixel SPX1, the area of the second sub-pixel SPX2, and the area of the third sub-pixel SPX3 may be different from another thereof. In another example, any two of the area of the first sub-pixel SPX1, the area of the second sub-pixel SPX2, and the area of the third sub-pixel SPX3 may be substantially the same, and the other thereof may be different from the two of the area. In another example, the area of the first sub-pixel SPX1, the area of the second sub-pixel SPX2, and the area of the third sub-pixel SPX3 may be different from each other.

Figure 4:
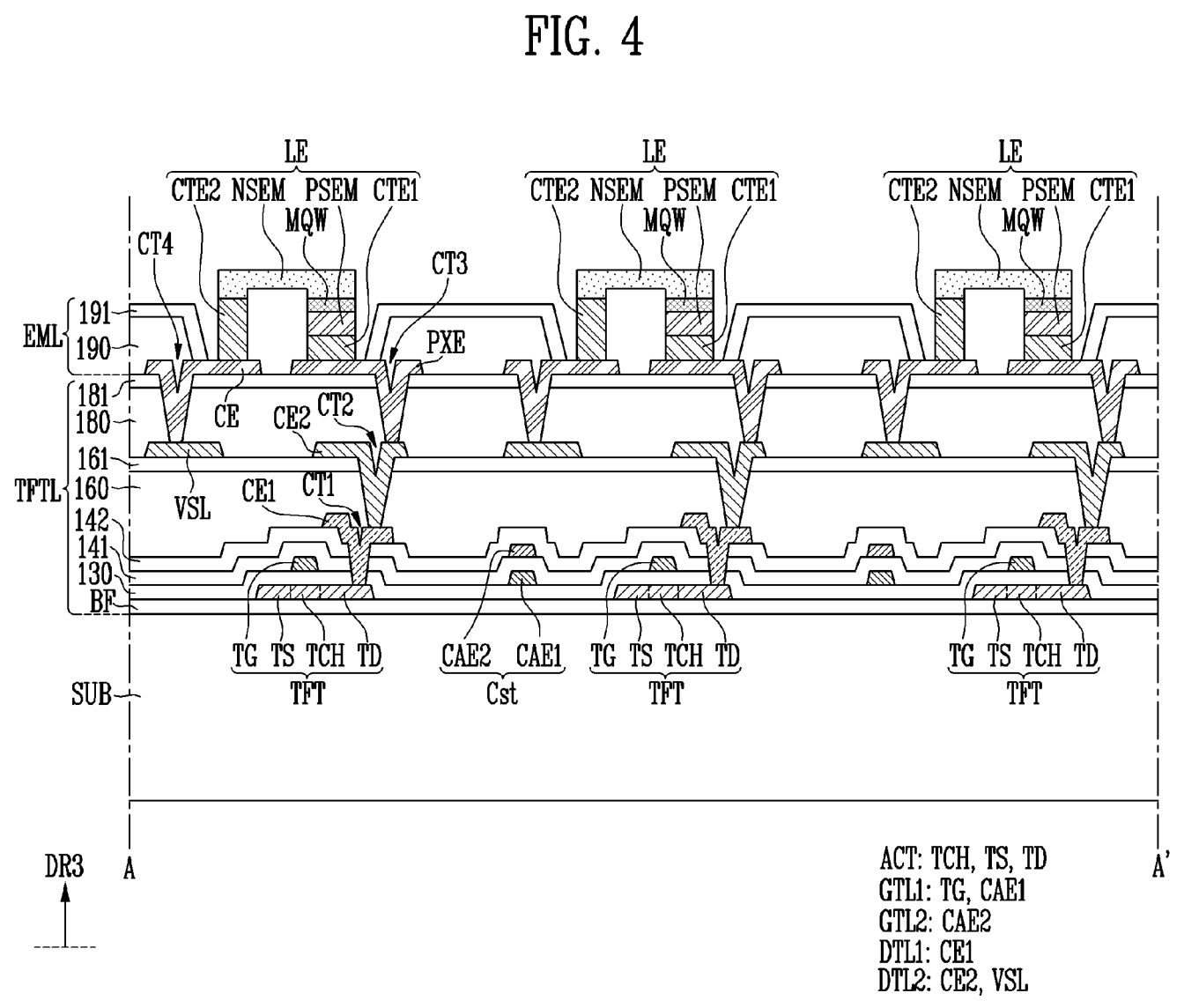

FIG. 4 is a schematic cross-sectional view illustrating an example of a display device taken along a line A-A' of FIG. 3.

Referring to FIG. 4, a thin film transistor layer TFTL may be disposed on the substrate SUB. The thin film transistor layer TFTL may be a layer on which thin film transistors (TFT) are formed.

The thin film transistor layer TFTL may include an active layer ACT, a first gate layer GTL1, a second gate layer GTL2, a first data metal layer DTL1, and a second data metal layer DTL2.

The display device 10 may include a buffer layer BF, a gate insulating layer 130, a first interlayer insulating layer 141, a second interlayer insulating layer 142, a first planarization layer 160, a first insulating layer 161, a second planarization layer 180, and a second insulating layer 181.

The substrate SUB may be a base substrate or a base member for supporting the display device 10. The substrate SUB may be a rigid substrate made of glass. In another example, the substrate SUB may be a flexible substrate capable of bending, folding, rolling, or the like. The substrate SUB may include an insulating material such as a polymer resin such as polyimide PI.

A buffer layer BF may be disposed on a surface of the substrate SUB. The buffer film BF may be a film for preventing a penetration of air or moisture. The buffer layer BF may include inorganic layers alternately stacked. For example, the buffer layer BF may be formed as a multilayer in which one or more inorganic layers of a silicon nitride layer, a silicon oxynitride layer, a silicon oxide layer, a titanium oxide layer, an aluminum oxide layer, or the like are alternately stacked. The buffer layer BF may be omitted.

The active layer ACT may be disposed on the buffer layer BF. The active layer ACT may include a silicon semiconductor such as polycrystalline silicon, single crystal silicon, low-temperature polycrystalline silicon, amorphous silicon, or the like, or may include an oxide semiconductor.

The active layer ACT may include a channel TCH, a first electrode TS, and a second electrode TD of the thin film transistor TFT. The channel TCH of the thin film transistor TFT may be an area overlapping a gate electrode TG of the thin film transistor TFT in a third direction DR3 that is the thickness direction of the substrate SUB. The first electrode TS of the thin film transistor TFT may be disposed on a side of the channel TCH, and the second electrode TD may be disposed on another side of the channel TCH. The first electrode TS and the second electrode TD of the thin film transistor TFT may be areas that do not overlap the gate electrode TG in the third direction DR3. The first electrode TS and the second electrode TD of the thin film transistor TFT may be areas in which ions are doped into a silicon semiconductor or an oxide semiconductor to have conductivity.

The gate insulating layer 130 may be disposed on the active layer ACT. The gate insulating layer 130 may be formed of an inorganic layer, for example, a silicon nitride layer, a silicon oxynitride layer, a silicon oxide layer, a titanium oxide layer, an aluminum oxide layer, or the like.

The first gate layer GTL1 may be disposed on the gate insulating layer 130. The first gate layer GTL1 may include a gate electrode TG and a first capacitor electrode CAE1 of the thin film transistor TFT. The first gate layer GTL1 may be formed of a single layer or multiple layers made of at least one of molybdenum (Mo), aluminum (Al), chromium (Cr), gold (Au), titanium (Ti), nickel (Ni), neodymium (Nd), copper (Cu), and the like, or an alloy thereof.

The first interlayer insulating layer 141 may be disposed on the first gate layer GTL1. The first interlayer insulating layer 141 may be formed of an inorganic layer, for example, a silicon nitride layer, a silicon oxynitride layer, a silicon oxide layer, a titanium oxide layer, an aluminum oxide layer, or the like.

The second gate layer GTL2 may be disposed on the first interlayer insulating layer 141. The second gate layer GTL2 may include a second capacitor electrode CAE2. The second gate layer GTL2 may be formed of a single layer or multiple layers made of at least one of molybdenum (Mo), aluminum (Al), chromium (Cr), gold (Au), titanium (Ti), nickel (Ni), neodymium (Nd), copper (Cu), and the like, or an alloy thereof.

The second interlayer insulating layer 142 may be disposed on the second gate layer GTL2. The second interlayer insulating layer 142 may be formed of an inorganic layer, for example, a silicon nitride layer, a silicon oxynitride layer, a silicon oxide layer, a titanium oxide layer, an aluminum oxide layer, or the like.

The first data metal layer DTL1 including a first connection electrode CE1 may be disposed on the second interlayer insulating layer 142. The first data metal layer DTL1 may be formed of a single layer or multiple layers made of at least one of molybdenum (Mo), aluminum (Al), chromium (Cr), gold (Au), titanium (Ti), nickel (Ni), neodymium (Nd), copper (Cu), and the like, or an alloy thereof.

The first connection electrode CE1 may be connected to the first electrode TS or the second electrode TD of the thin film transistor TFT through a first contact hole CT1 penetrating the first interlayer insulating layer 141 and the second interlayer insulating layer 142.

On the first data metal layer DTL1, the first planarization layer 160 for flattening a step caused by the active layer ACT, the first gate layer GTL1, the second gate layer GTL2, and the first data metal layer DTL1, may be formed. The first planarization film 160 may be formed of an organic layer such as acrylic resin, epoxy resin, phenolic resin, polyamide resin, polyimide resin, or the like.

The first insulating layer 161 may be disposed on the first planarization layer 160. The first insulating layer 161 may be formed of an inorganic layer, for example, a silicon nitride layer, a silicon oxynitride layer, a silicon oxide layer, a titanium oxide layer, or an aluminum oxide layer.

The second data metal layer DTL2 may be formed on the first insulating layer 161. The second data metal layer DTL2 may include a second connection electrode CE2 and a power line VSL. The second connection electrode CE2 may be connected to the first connection electrode CE1 through a second contact hole CT2 penetrating the first insulating layer 161 and the first planarization layer 160. The second data metal layer DTL2 may be formed of a single layer or multiple layers made of at least one of molybdenum (Mo), aluminum (Al), chromium (Cr), gold (Au), titanium (Ti), nickel (Ni), neodymium (Nd), copper (Cu), and the like, or an alloy thereof.

The second planarization layer 180 for flattening a step may be formed on the second data metal layer DTL2. The second planarization film 180 may be formed of an organic layer such as acrylic resin, epoxy resin, phenolic resin, polyamide resin, polyimide resin, or the like.

The second insulating layer 181 may be disposed on the second planarization layer 180. The second insulating layer 181 may be formed of an inorganic layer, for example, a silicon nitride layer, a silicon oxynitride layer, a silicon oxide layer, a titanium oxide layer, or an aluminum oxide layer.

A light emitting element layer EML may be disposed on the second insulating layer 181. The light emitting element layer EML may include pixel electrodes PXE, common electrodes CE, and light emitting elements LE. Each of the first sub-pixel SPX1, the second sub-pixel SPX2, and the third sub-pixel SPX3 may include the light emitting element LE connected to the pixel electrode PXE and the common electrode CE. The pixel electrode PXE may be referred to as an anode electrode, and the common electrode CE may be referred to as a cathode electrode.

The pixel electrodes PXE and the common electrodes CE may be disposed on the second insulating layer 181. Each of the pixel electrodes PXE may be connected to the second connection electrode CE2 through a third contact hole CT3 penetrating the second insulating layer 181 and the second planarization layer 180. Accordingly, each of the pixel electrodes PXE may be connected to the first electrode TS or the second electrode TD of the thin film transistor TFT through the first connection electrode CE1 and the second connection electrode CE2. Therefore, a pixel voltage or an anode voltage controlled by the thin film transistor TFT may be applied to the pixel electrode PXE.

Each of the common electrodes CE may be connected to the power line VSL through a fourth contact hole CT4 penetrating the second insulating layer 181 and the second planarization layer 180. Accordingly, a first power voltage of the power line VSL may be applied to each of the common electrodes CE.

The pixel electrodes PXE and the common electrodes CE may include a metal material having a high reflectance, such as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO. The APC alloy may be an alloy including silver (Ag), palladium (Pd), and copper (Cu).

In FIG. 4, it is illustrated that each of the light emitting elements LE is a flip-chip type micro LED in which a first contact electrode CTE1 and a second contact electrode CTE2 are disposed to face the pixel electrode PXE and the common electrode CE. The light emitting element LE may be formed of an inorganic material such as GaN. The light emitting element LE may have each of a length in the first direction DR1, a length in the second direction DR2, and a length in the third direction DR3 in a range of several to several hundred micrometers (μm). For example, the light emitting element LE may have each of the length in the first direction DR1, the length in the second direction DR2, and the length in the third direction DR3 of about 100 μm or less.

Each of the light emitting elements LE may be a light emitting structure including an n-type semiconductor NSEM, an active layer MQW, a p-type semiconductor PSEM, a first contact electrode CTE1, and a second contact electrode CTE2.

A portion of the n-type semiconductor NSEM may be disposed on the active layer MQW. A portion of the n-type semiconductor NSEM may be disposed on the second contact electrode CTE2. According to embodiments, a surface of the n-type semiconductor NSEM may face a display surface. The n-type semiconductor NSEM may be formed of GaN doped with an n-type dopant such as Si, Ge, or Sn.

The active layer MQW may be disposed on a portion of a surface of the n-type semiconductor NSEM. The active layer MQW may be interposed between the n-type semiconductor NSEM and the p-type semiconductor PSEM. The active layer MQW may include a material having a single or multiple quantum well structure. In case that the active layer MQW includes a material having a multi-quantum well structure, well layers and barrier layers may be alternately stacked. The well layer may be formed of InGaN, and the barrier layer may be formed of GaN or AlGaN, but is not limited thereto. In another example, the active layer MQW may have a structure in which a type of semiconductor material having a large band gap energy and a type of semiconductor material having a small band gap energy are alternately stacked, and may also include group three to group five semiconductor materials that vary depending on the wavelength band of the emitted light.

The p-type semiconductor PSEM may be disposed on a surface of the active layer MQW. The p-type semiconductor PSEM may be formed of GaN doped with a p-type dopant such as Mg, Zn, Ca, Se, Ba, or the like.

The first contact electrode CTE1 may be disposed on the p-type semiconductor PSEM, and the second contact electrode CTE2 may be disposed on another portion of a surface of the n-type semiconductor NSEM. Another portion of a surface of the n-type semiconductor NSEM on which the second contact electrode CTE2 is disposed may be disposed apart from a portion of a surface of the n-type semiconductor NSEM on which the active layer MQW is disposed.

The first contact electrode CTE1 and the pixel electrode PXE may be bonded to each other through a conductive adhesive member such as an anisotropic conductive film (ACF) or an anisotropic conductive paste (ACP). In another example, the first contact electrode CTE1 and the pixel electrode PXE may be bonded to each other through a soldering process.

According to embodiments, although not shown in the drawings, the element insulating layer INS (see, e.g., FIG. 11) and the first contact electrode CTE1 may be disposed on a same layer. The element insulating layer INS may stabilize an electrical connection between the first contact electrode CTE1 and the p-type semiconductor PSEM.

A bank 190 covering an edge of the pixel electrode PXE and an edge of the common electrode CE may be disposed on the second insulating layer 181. The bank 190 may be formed of an organic layer such as an acrylic resin, an epoxy resin, a phenolic resin, a polyamide resin, a polyimide resin, or the like.

The third insulating layer 191 may be disposed on the bank 190. The third insulating layer 191 may cover the edge of the pixel electrode PXE and the edge of the common electrode CE. The third insulating layer 191 may be formed of an inorganic layer, for example, a silicon nitride layer, a silicon oxynitride layer, a silicon oxide layer, a titanium oxide layer, an aluminum oxide layer, or the like.

Figure 5:
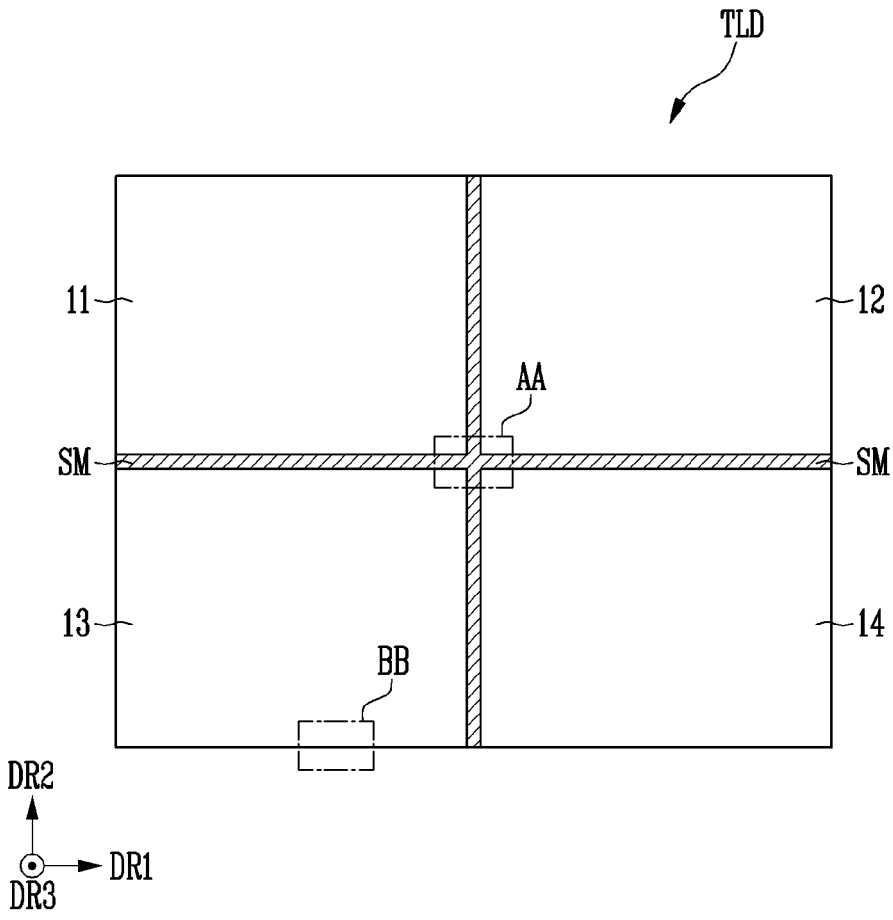
FIG. 5 is a schematic perspective view illustrating a tile type display device including display devices according to an embodiment.

FIG. 5 is a schematic perspective view illustrating a tile type display device including display devices according to an embodiment.

Referring to FIG. 5, the tile type display device TLD may include display devices 11, 12, 13, and 14, and a joint SM. For example, the tile type display device TLD may include a first display device 11, a second display device 12, a third display device 13, and a fourth display device 14.

The display devices 11, 12, 13, and 14 may be arranged in a grid shape. The display devices 11, 12, 13, and 14 may be arranged in a matrix form in M (M is a positive integer) number of rows and N (N is a positive integer) number of columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the display devices 11, 12, 13, and 14 in the tile type display device TLD are not limited to those illustrated in FIG. 5. The number and arrangement of the display devices 11, 12, 13, and 14 in the tile type display device TLD may be determined depending on a size of each of the display device 10 and the tile type display device TLD and a shape of the tile type display device TLD.

Each of the display devices 11, 12, 13, and 14 may have substantially a same size, but is not limited thereto. For example, each of the display devices 11, 12, 13, and 14 may have different sizes.

Each of the display devices 11, 12, 13, and 14 may have a rectangular shape including a long side and a short side. The display devices 11, 12, 13, and 14 may be disposed with long sides or short sides connected to each other. Some or all of the display devices 11, 12, 13, and 14 may be disposed at an edge of the tile type display device TLD, and may form a side of the tile type display device TLD. At least one display device among the display devices 11, 12, 13, and 14 may be disposed at at least one corner of the tile type display device TLD, and may form two adjacent sides of the tile type display device TLD. At least one display device among the display devices 11, 12, 13, and 14 may be surrounded by other display devices.

Each of the display devices 11, 12, 13, and 14 may be substantially identical or similar to the display device 10 described with reference to FIGS. 1 to 4. Therefore, a description of each of the display devices 11, 12, 13, and 14 will be omitted.

The joint SM may include a coupling member or an adhesive member. The display devices 11, 12, 13, and 14 may be connected to each other through a coupling member or an adhesive member of the joint SM. The joint SM may be disposed between the first display device 11 and the second display device 12, between the first display device 11 and the third display device 13, between the second display device 12 and the fourth display device 12, and/or between the third display device 13 and the fourth display device 14.

Figure 6:
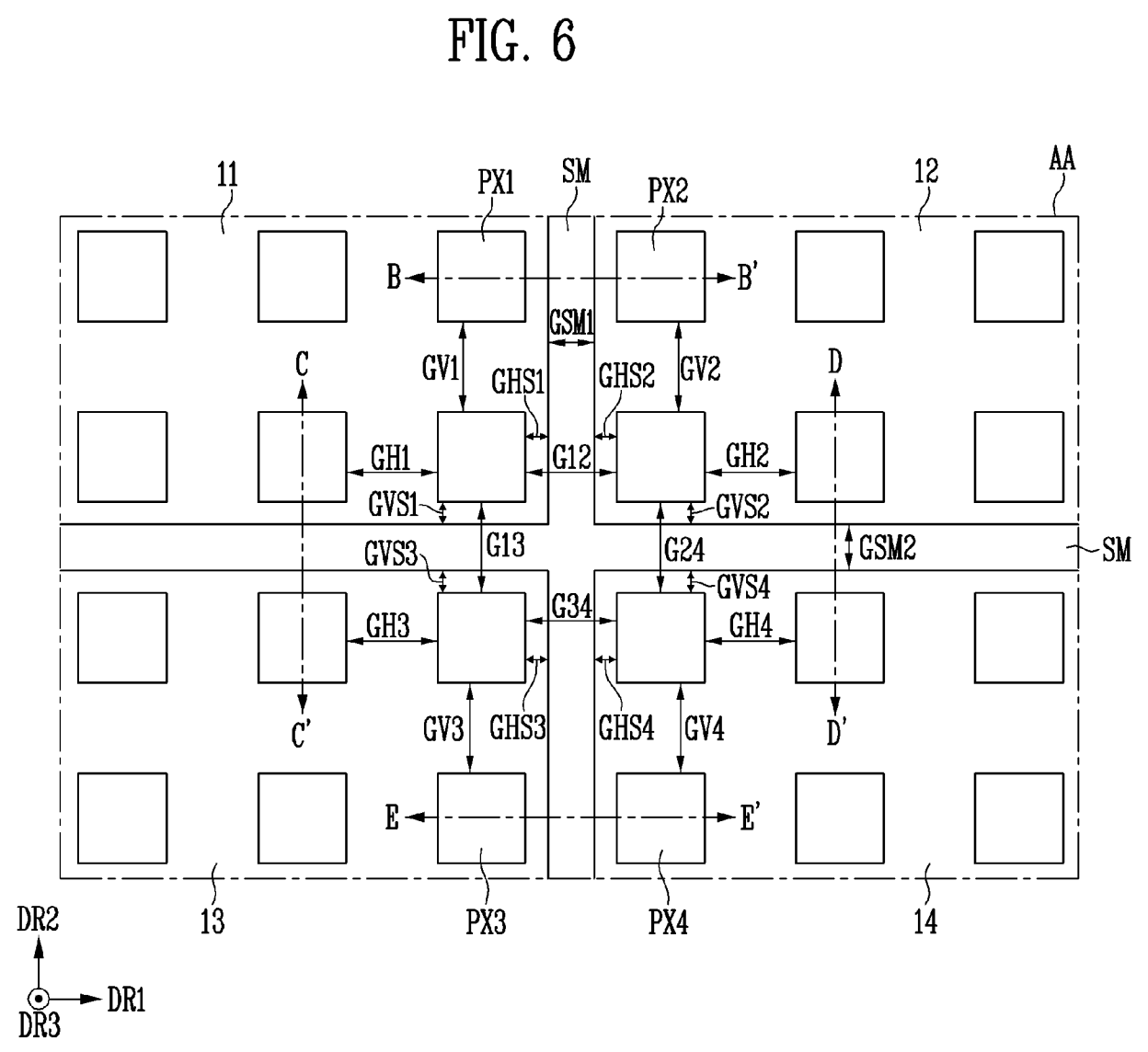

FIG. 6 is a schematic enlarged layout drawing illustrating in detail area AA of FIG. 5.

Referring to FIG. 6, the joint SM may have a planar shape of a cross, the Cross, or a plus sign in a central area of the tile type display device TLD in which the first display device 11, the second display device 12, the third display device 13, and the fourth display device 14 are adjacent to each other. The joint SM may be disposed between the first display device 11 and the second display device 12, between the first display device 11 and the third display device 13, between the second display device 12 and the fourth display device 12, and/or between the third display device 13 and the fourth display device 14.

The first display device 11 may include first pixels PX1 arranged in the matrix form in the first direction DR1 and the second direction DR2 to display an image. The second display device 12 may include second pixels PX2 arranged in the matrix form in the first direction DR1 and the second direction DR2 to display an image. The third display device 13 may include third pixels PX3 arranged in the matrix form in the first direction DR1 and the second direction DR2 to display an image. The fourth display device 14 may include fourth pixels PX4 arranged in the matrix form in the first direction DR1 and the second direction DR2 to display an image.

A minimum distance between the first pixels PX1 adjacent in the first direction DR1 may be defined as a first horizontal separation distance GH1, and a minimum distance between the second pixels PX2 adjacent in the first direction DR1 may be defined as the second horizontal separation distance GH2. The first horizontal separation distance GH1 and the second horizontal separation distance GH2 may be substantially the same.

The joint SM may be disposed between the first pixel PX1 and the second pixel PX2 adjacent in the first direction DR1. A minimum distance G12 between the first and second pixels PX1 and PX2 adjacent in the first direction DR1 may be sum of a minimum distance GHS1 between the first pixel PX1 and the joint SM in the first direction DR1, a minimum distance GHS2 between the second pixel PX2 and the joint SM in the first direction DR1, and a width GSM1 of the joint SM in the first direction DR1.

The minimum distance G12 between the first pixel PX1 and the second pixel PX2 adjacent in the first direction DR1, the first horizontal separation distance GH1, and the second horizontal separation distance GH2 may be substantially the same. To this end, the minimum distance GHS1 between the first pixel PX1 and the joint SM in the first direction DR1 may be smaller than the first horizontal separation distance GH1, and the minimum distance GHS2 between the second pixel PX2 and the joint SM in the first direction DR1 may be smaller than the second horizontal separation distance GH2. Also, the width GSM1 of the joint SM in the first direction DR1 may be smaller than the first horizontal separation distance GH1 or the second horizontal separation distance GH2.

A minimum distance between the third pixels PX3 adjacent in the first direction DR1 may be defined as a third horizontal separation distance GH3, and a minimum distance between a fourth pixels PX4 adjacent in the first direction DR1 may be defined as a fourth horizontal separation distance GH4. The third horizontal separation distance GH3 and the fourth horizontal separation distance GH4 may be substantially the same.

The joint SM may be disposed between the third pixel PX3 and the fourth pixel PX4 adjacent in the first direction DR1. A minimum distance G34 between the third pixel PX3 and the fourth pixel PX4 adjacent in the first direction DR1 may be sum of a minimum distance GHS3 between the third pixel PX3 and the joint SM in the first direction DR1, a minimum distance GHS4 between the fourth pixel PX4 and the joint SM in the first direction DR1, and a width GSM1 of the joint SM in the first direction DR1.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the joint SM in the first direction DR1 may be smaller than the third horizontal separation distance GH3, and the minimum distance GHS4 between the fourth pixel PX4 and the joint SM in the first direction DR1 may be smaller than the fourth horizontal separation distance GH4. Also, a width GSM1 of the joint SM in the first direction DR1 may be smaller than the third horizontal separation distance GH3 or the fourth horizontal separation distance GH4.

The minimum distance between the first pixels PX1 adjacent in the second direction DR2 may be defined as a first vertical separation distance GV1, and the minimum distance between the third pixels PX3 adjacent in the second direction DR2 may be defined as a third vertical separation distance GV3. The first vertical separation distance GV1 and the third vertical separation distance GV3 may be substantially the same.

The joint SM may be disposed between the first pixel PX1 and the third pixel PX3 adjacent in the second direction DR2. A minimum distance G13 between the first pixel PX1 and the third pixel PX3 adjacent in the second direction DR2 may be sum of a minimum distance GVS1 between the first pixel PX1 and the joint SM in the second direction DR2, the minimum distance GVS3 between the third pixel PX3 and the joint SM in the second direction DR2, and a width GSM2 of the joint SM in the second direction DR2.

The minimum distance G13 between the first pixel PX1 and the third pixel PX3 adjacent in the second direction DR2, the first vertical separation distance GV1, and the third vertical separation distance GV3 may be substantially the same. To this end, the minimum distance GVS1 between the first pixel PX1 and the joint SM in the second direction DR2 may be smaller than the first vertical separation distance GV1, and the minimum distance GVS3 between the third pixel PX3 and the joint SM in the second direction DR2 may be smaller than the third vertical separation distance GV3. Also, the width GSM2 of the joint SM in the second direction DR2 may be smaller than the first vertical separation distance GV1 or the third vertical separation distance GV3.

The minimum distance between the second pixels PX2 adjacent in the second direction DR2 may be defined as a second vertical separation distance GV2, and the minimum distance between the fourth pixels PX4 adjacent in the second direction DR2 may be defined as a fourth vertical separation distance GV4. The second vertical separation distance GV2 and the fourth vertical separation distance GV4 may be substantially the same.

The joint SM may be disposed between the second pixel PX2 and the fourth pixel PX4 adjacent in the second direction DR2. The minimum distance G24 between the second pixel PX2 and the fourth pixel PX4 adjacent in the second direction DR2 may be sum of the minimum distance GVS2 between the second pixel PX2 and the joint SM in the second direction DR2, the minimum distance GVS4 between the fourth pixel PX4 and the joint SM in the second direction DR2, and the width GSM2 of the joint SM in the second direction DR2.

A minimum distance G24 between the second pixel PX2 and the fourth pixel PX4 adjacent in the second direction DR2, the second vertical separation distance GV2, and the fourth vertical separation distance GV4 may be substantially the same. To this end, the minimum distance GVS2 between the second pixel PX2 and the joint SM in the second direction DR2 may be smaller than the second vertical separation distance GV2, and the minimum distance GVS4 between the fourth pixel PX4 and the joint SM in the second direction DR2 may be smaller than the fourth vertical separation distance GV4. Also, the width GSM2 of the joint SM in the second direction DR2 may be smaller than the second vertical separation distance GV2 or the fourth vertical separation distance GV4.

As shown in FIG. 6, in order to prevent the joint SM from being recognized between images displayed by the display devices 11, 12, 13, and 14, the minimum distance between pixels of adjacent display devices may be substantially the same as the minimum distance between the pixels of each of the devices.

Figure 7:
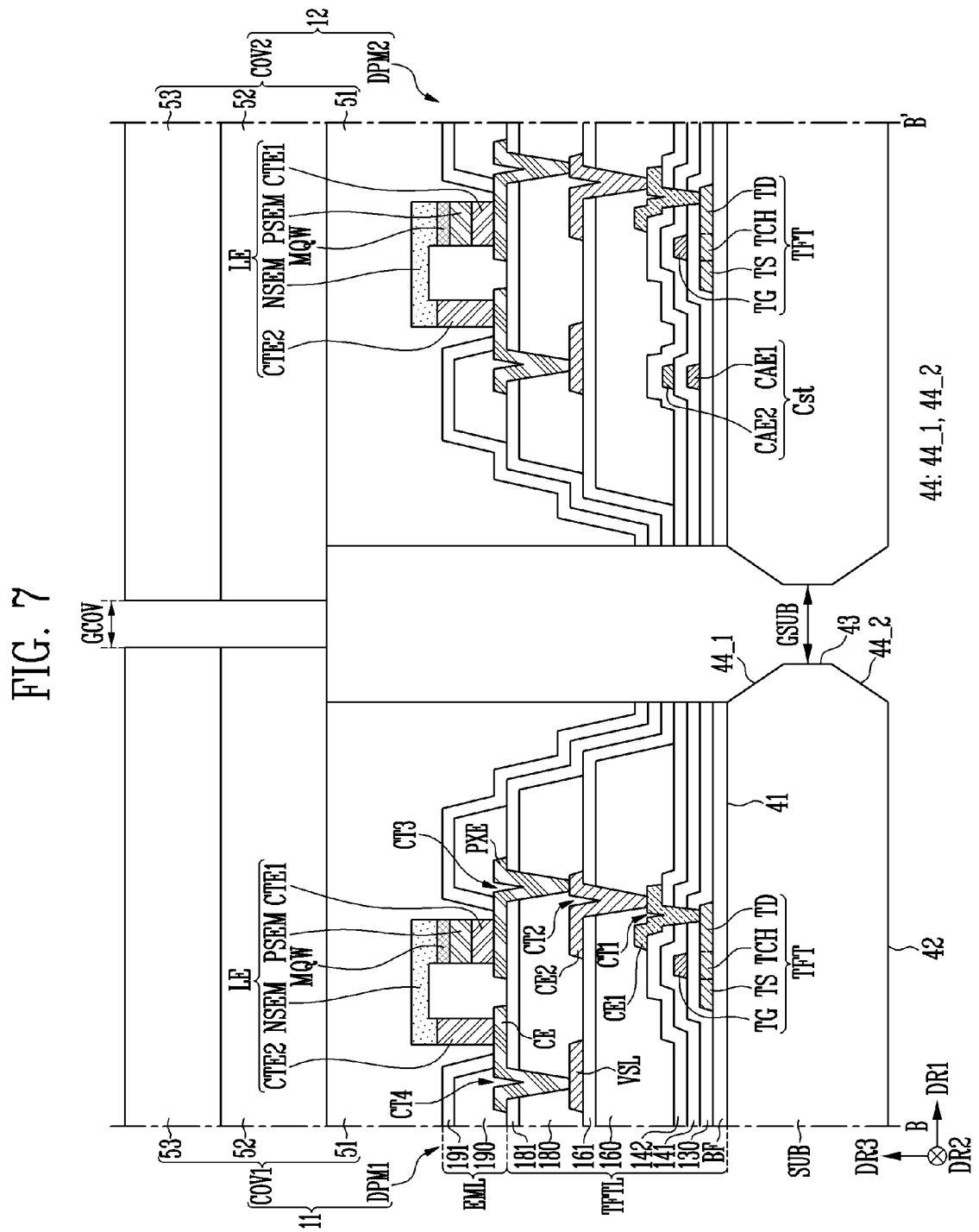
FIG. 7 is a schematic cross-sectional view illustrating an example of a tiled type display device taken along line B-B' of FIG. 6.

FIG. 7 is a schematic cross-sectional view illustrating an example of a tiled type display device taken along line B-B' of FIG. 6.

Referring to FIG. 7, the first display device 11 may include a first display module DPM1 and a first front cover COV1. The second display device 12 may include a second display module DPM2 and a second front cover COV2.

Each of the first display module DPM1 and the second display module DPM2 may include a substrate SUB, a thin film transistor layer TFTL, and a light emitting element layer EML. The thin film transistor layer TFTL and the light emitting element layer EML have already been described in detail with reference to FIG. 4. In FIG. 7, repetitive descriptions with respect to those of FIG. 4 will be omitted.

The substrate SUB may include a first surface 41 on which the thin film transistor layer TFTL is disposed, a second surface 42 facing the first surface, and a first side surface 43 disposed between the first surface 41 and the second surface 42. The first surface 41 may be a front surface or an upper surface of the substrate SUB, and the second surface 42 may be a rear surface or a lower surface of the substrate SUB.

The substrate SUB may further include chamfer surfaces 44_1 and 44_2 disposed between the first surface 41 and the first side surface 43 and between the second surface 42 and the first side surface 43. A thin film transistor layer TFTL and the light emitting element layer EML may not be disposed on the chamfer surfaces 44_1 and 44_2. Because of the chamfer surfaces 44_1 and 44_2, it is possible to prevent the substrate SUB of the first display device 11 and the substrate SUB of the second display device 12 from being collided with each other to be damaged.

The chamfer surfaces 44_1 and 44_2 may also be disposed between the first surface 41 and each of the other side surfaces except for the first side surface 43, and between the second surface 42 and each of the other side surfaces except for the first side surface 43. For example, in case that the first display device 11 and the second display device 12 have a rectangular planar shape as shown in FIG. 5, the chamfer surfaces 44_1 and 44_2 may be disposed between the first surface 41 and each of a second side surface, a third side surface, and a fourth side surface, and between the second side 42 and each of the second side surface, the third side surface, and the fourth side surface.

The first front cover COV1 may be disposed on the chamfer surface 44 of the substrate SUB. For example, the first front cover COV1 may protrude more than the substrate SUB in the first direction DR1 and the second direction DR2. Therefore, a distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance control layer 52.

The adhesive member 51 of the first front cover COV1 may serve to attach the light emitting element layer EML of the first display module DPM1 to the first front cover COV1. The adhesive member 51 of the second front cover COV2 may serve to attach the light emitting element layer EML of the second display module DPM2 to the second front cover COV2. The adhesive member 51 may be a transparent adhesive member capable of transmitting light. For example, the adhesive member 51 may be an optically clear adhesive film or an optically clear resin.

The anti-glare layer 53 may be designed to diffusely reflect external light to prevent deterioration of image visibility caused by reflecting external light as it is. Accordingly, a contrast ratio of images displayed by the first display device 11 and the second display device 20 may increase because of the anti-glare layer 53.

The light transmittance control layer 52 may be designed to reduce transmittance of external light or light reflected from the first display module DPM1 and the second display module DPM2. Accordingly, the distance GSUB between the substrate SUB of the first display module DPM1 and the substrate SUB of the second display module DPM2 may be prevented from being visually recognized from an outside.

The anti-glare layer 53 may be implemented as a polarizing plate, and the light transmittance adjusting layer 52 may be implemented as a phase retarder layer, but embodiments of the disclosure is not limited thereto.

Since examples of the tile type display device taken along lines C-C', D-D', and E-E' of FIG. 6 are substantially identical or similar to an example of the tile type display device taken along line B-B' described with reference to FIG. 7, descriptions thereof will be omitted.

Figure 8:
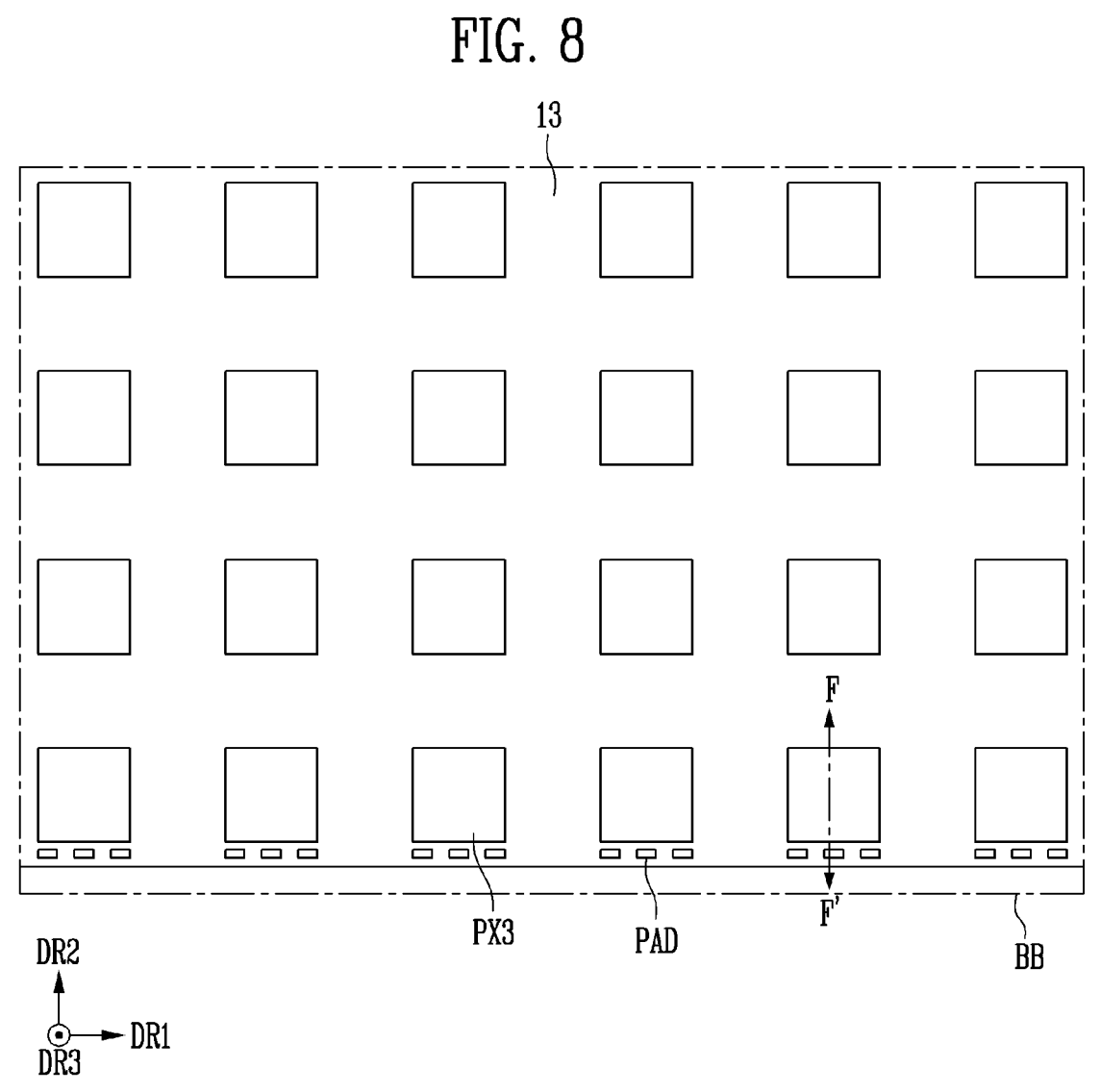

FIG. 8 is a schematic enlarged layout drawing illustrating in detail an area BB of FIG. 5. In FIG. 8, pads PAD and the third pixel PX3 disposed in the lower side of the third display device 13 are shown for convenience of description. The first display device 11, the second display device 12, and the fourth display device 14 have substantially a same configuration as the third display device 13, and thus repetitive descriptions will be omitted.

Referring to FIG. 8, the pads PAD may be disposed on a lower edge of the third display device 13. In case that data lines DL (see, e.g., FIG. 9) of the third display device 13 extend in the second direction DR2, the pads PAD may be disposed on upper and lower edges of the third display device 13. In another example, in case that the data lines DL (see, e.g., FIG. 9) of the third display device 13 extend in the first direction DR1, the pads PAD may be disposed on left and right edges of the third display device 13.

Each of the pads PAD may be connected to the data line DL on the upper surface of the substrate SUB. Also, each of the pads PAD may be connected to a side line SSL. The side line SSL may be disposed on an upper surface, a side surface, and a lower surface (or a rear surface) of the substrate SUB. The side line SSL may be connected to a connection line CCL (see FIG. 9) on the lower surface of the substrate SUB.

Figure 9:
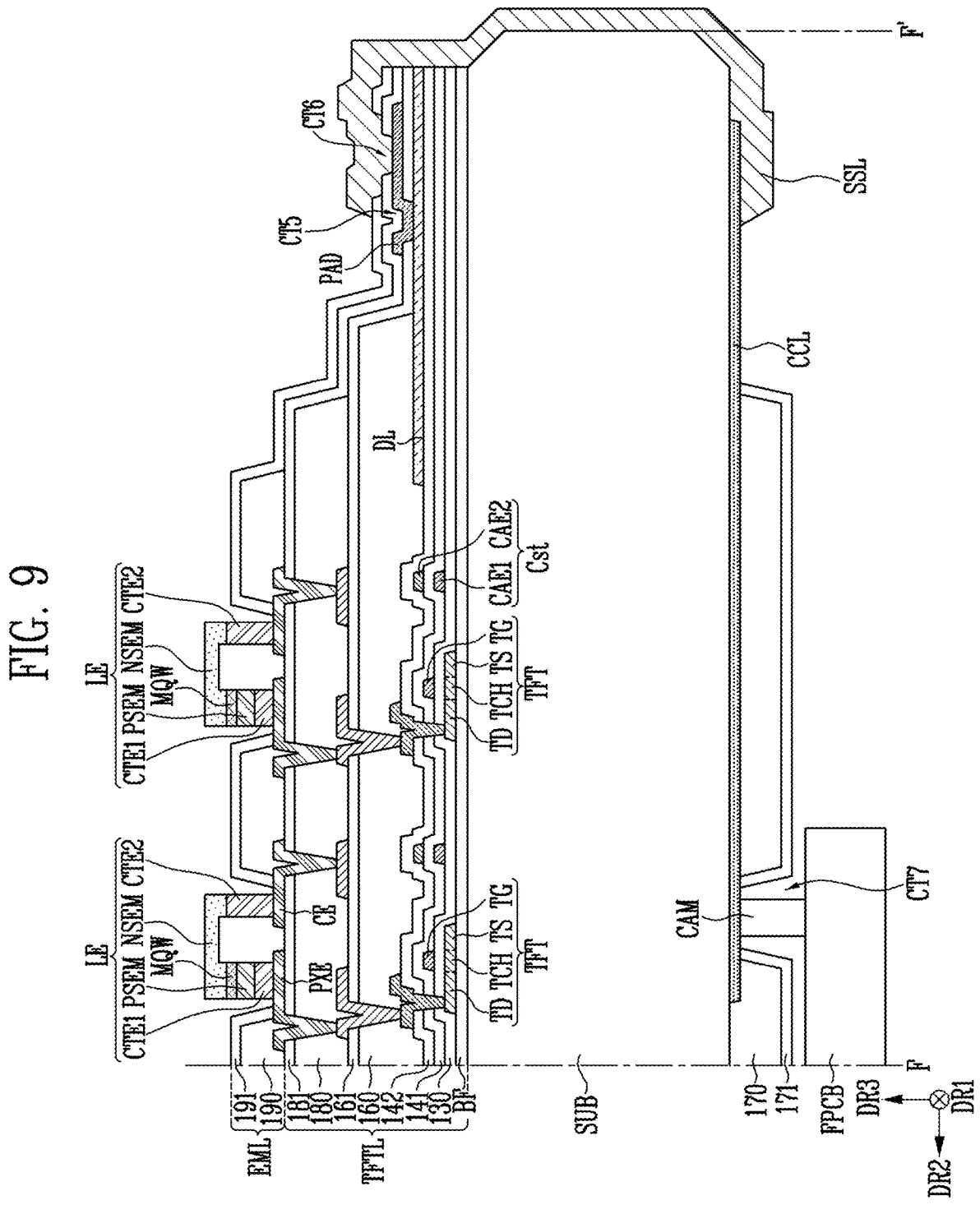
FIG. 9 is a schematic cross-sectional view illustrating an example of a tile type display device taken along line F-F' of FIG. 8.

FIG. 9 is a schematic cross-sectional view illustrating an example of a tile type display device taken along line F-F' of FIG. 8. In FIG. 9, the same reference numerals are assigned to the same components as those of the cross-sectional view shown in FIG. 4, and the repetitive description with respect to those of FIG. 4 will be omitted.

Referring to FIG. 9, the pad PAD may be disposed on the first insulating layer 161. A portion of the pad PAD may be exposed without being covered by the second insulating layer 181 and the third insulating layer 191. The pad PAD, the pixel electrodes PXE, and common electrodes CE may include a same material. For example, the pad PAD may include a metal material having a high reflectance, such as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO.

The first data metal layer DTL1 (see, e.g., FIG. 4) may include a data line DL. The data line DL may be disposed on the second interlayer insulating layer 142. For example, the data line DL and the first connection electrode CE1 may be disposed on a same layer, and may include a same material.

The pad PAD may be connected to the data line DL through a fifth contact hole CT5 penetrating the first planarization layer 160, the first insulating layer 161, the second planarization layer 180, and the second insulating layer 181.

A connection line CCL may be disposed on the lower surface of the substrate SUB. The connecting line CCL may be formed of a single layer or multiple layers made of at least one of molybdenum (Mo), aluminum (Al), chromium (Cr), gold (Au), titanium (Ti), nickel (Ni), neodymium (Nd), copper (Cu), and the like, or an alloy thereof.

The third planarization layer 170 may be disposed on a portion of the connection line CCL. The third planarization film 170 may be formed of an organic layer such as acrylic resin, epoxy resin, phenolic resin, polyamide resin, polyimide resin, or the like.

The fourth insulating layer 171 may be disposed on the third planarization layer 170. The fourth insulating layer 171 may be formed of an inorganic layer, for example, a silicon nitride layer, a silicon oxynitride layer, a silicon oxide layer, a titanium oxide layer, an aluminum oxide layer, or the like.

A side line SSL may be disposed on the upper surface edge, the side surface, and the lower surface edge of the substrate SUB. An end of the side line SSL may be connected to the pad PAD. An end of the side line SSL may be connected to the pad PAD through the sixth contact hole CT6 penetrating the third insulating layer 191. Another end of the side line SSL may be connected to the connection line CCL.

The side line SSL may be disposed on the side surface of the substrate SUB, a side surface of the buffer layer BF, a side surface of the gate insulating layer 130, a side surface of the first interlayer insulating layer 141, a side surface of the second interlayer insulating layer 142, a side surface of the second interlayer insulating layer 142, a side surface of the first insulating layer 161, and a side surface of the second insulating layer 181.

The side line SSL may connect the pad PAD formed on the upper surface edge of the substrate SUB and the connection line CCL formed on the lower surface edge of the substrate SUB.

Figure 18:
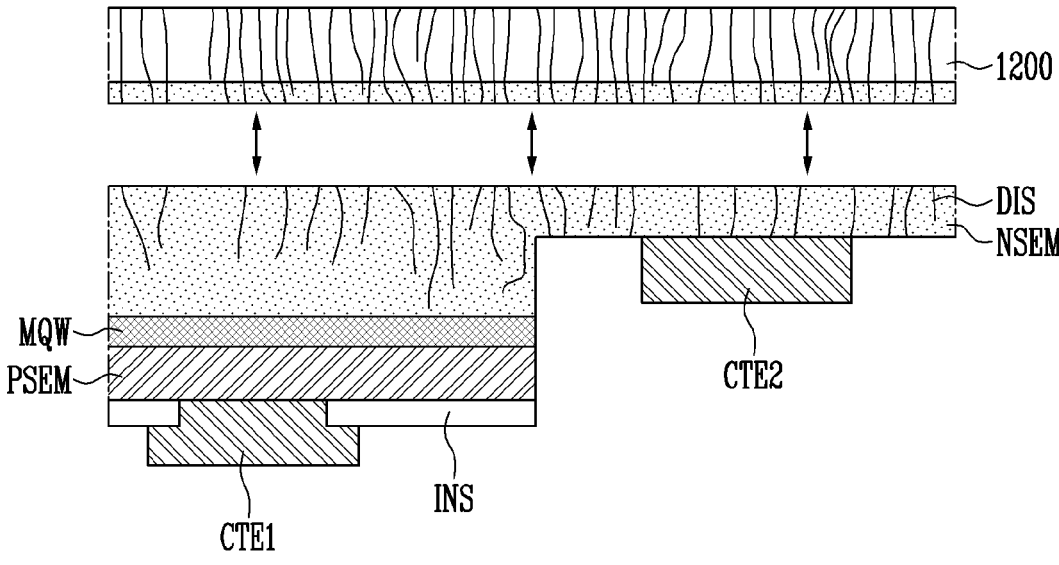

The light emitting elements LE disposed on the light emitting element layer EML may be transferred onto a pixel electrode PXE and the common electrode CE of the substrate SUB through an electrostatic method using an electrostatic head or a stamp method using an elastic polymer material such as polydimethylsiloxane (PDMS) or silicon as a transfer substrate (see, e.g., TSUB of FIG. 18).

A flexible film FPCB may be disposed on a lower surface of the fourth insulating layer 171. The flexible film FPCB may be connected to the connection line CCL through a seventh contact hole CT7 penetrating the third planarization layer 170 and the third insulating layer 171 using a conductive adhesive member CAM. A source driving circuit for supplying data voltages to the data lines DL may be disposed on a lower surface of the flexible film FPCB. The conductive adhesive member CAM may be an anisotropic conductive film or an anisotropic conductive paste.

As shown in FIGS. 8 and 9, in the third display device 13, the source driving circuit of the flexible film FPCB disposed under the substrate SUB may be connected to the data line DL through the connection line CCL, the side line SSL, and the pad PAD. For example, since the source driving circuit SIC is disposed on the substrate SUB, the non-display area NDA may be eliminated, and thus the pixels PX may be formed at the edge of the substrate SUB.

Figure 10:
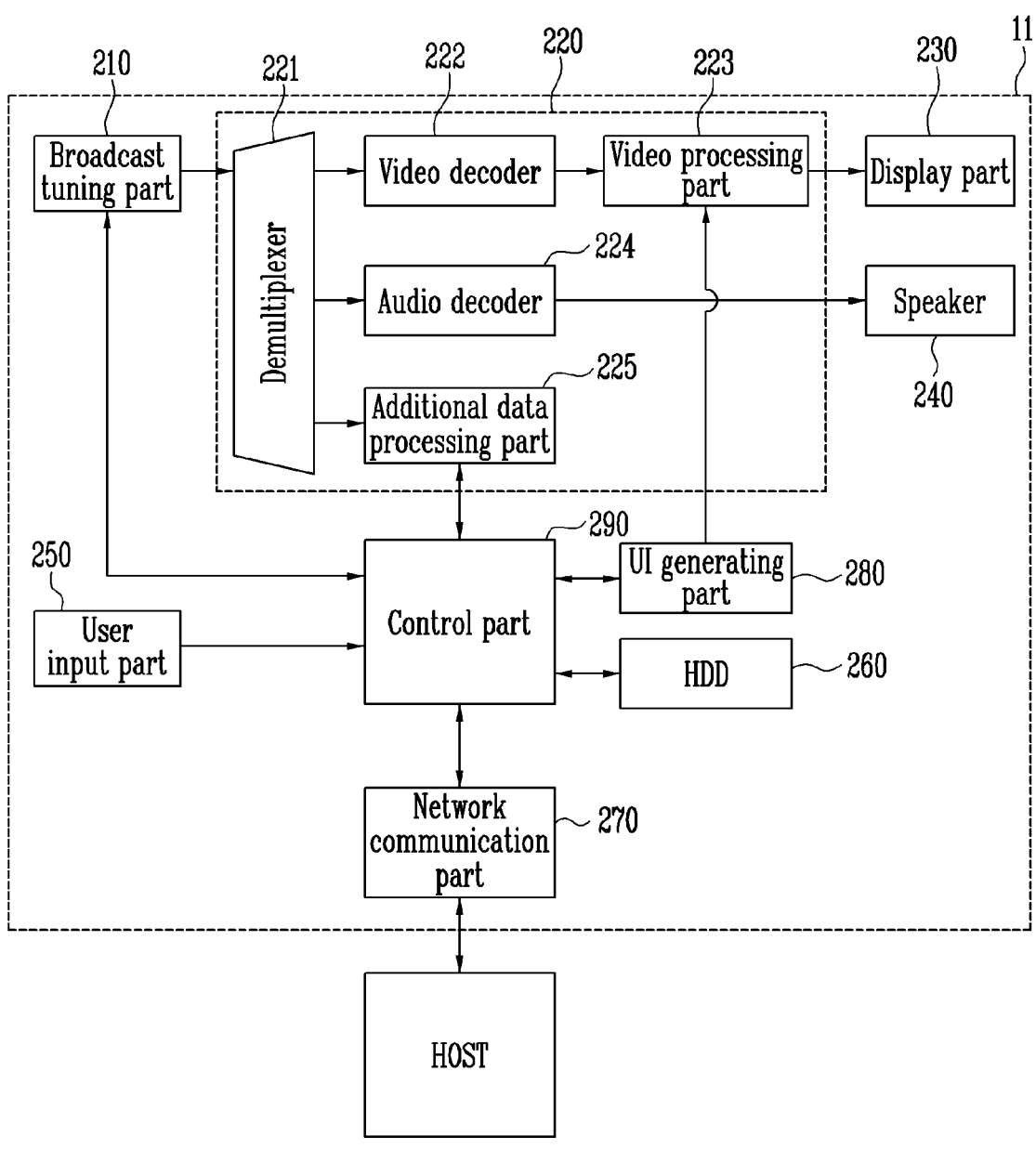
FIG. 10 is a schematic block diagram illustrating a tile type display device according to an embodiment.

FIG. 10 is a schematic block diagram illustrating a tile type display device according to an embodiment.

In FIG. 10, a first display device 11 and a host system HOST are illustrated for convenience of description.

Referring to FIG. 10, a tile type display device TLD according to an embodiment may include a host system HOST, a broadcast tuning part 210, a signal processing part 220, a display part 230, a speaker 240, a user input part 250, an HDD 260, a network communication part 270, a UI generating part 280, and a control part 290.

The host system HOST may be implemented as at least one of a television system, a home theater system, a set-top box, a navigation system, a DVD player, a Blu-ray player, a personal computer (PC), a mobile phone system, a tablet, and the like.

A user's command may be input to the host system HOST in various formats. For example, a command by a user's touch input may be input to the host system HOST. In another example, a user's command may be input to the host system HOST by a keyboard input or a button input of a remote controller.

The host system HOST may receive original video data corresponding to an original image from an outside. The host system HOST may divide the original video data by the number of display devices. For example, the host system HOST may divide the original video data into the first video data corresponding to the first image, the second video data corresponding to the second image, the third video data corresponding to the third image, and the fourth video data corresponding to the fourth image, corresponding to the first display device 11, the second display device 12, the third display device 13, and the fourth display device 14. The host system HOST may transfer the first video data to the first display device 11, the second video data to the second display device 12, the third video data to the third display device 13, and the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may view the original image in which the first to fourth images displayed on the first to fourth display devices 11, 12, 13 and 14 are combined.

The first display device 11 may include a broadcast tuning part 210, a signal processing part 220, a display part 230, a speaker 240, a user input part 250, an HDD 260, a network communication part 270, and a UI generating part 280, and a control part 290.

The broadcast tuning part 210 may receive a broadcast signal of the corresponding channel through an antenna by tuning a channel frequency (e.g., a predetermined or selectable channel frequency) under a control of the control part

290. The broadcast tuning part 210 may include a channel detection module and an RF demodulation module.

The broadcast signal demodulated by the broadcast tuning part 210 may be processed by the signal processing part 220 and be output to the display part 230 and the speaker 240. Here, the signal processing part 220 may include a demultiplexer 221, a video decoder 222, a video processing part 223, an audio decoder 224, and an additional data processing part 225.

The demultiplexer 221 may divide the demodulated broadcast signal into a video signal, an audio signal, and additional data. The divided video signal, audio signal, and additional data may be restored by the video decoder 222, the audio decoder 224, and the additional data processing part 225, respectively. The video decoder 222, the audio decoder 224, and the additional data processing part 225 may restore a decoding format corresponding to an encoding format when the broadcast signal is transferred.

The decoded video signal may be converted by the video processing part 223 to fit a vertical frequency, a resolution, an aspect ratio, or the like that meets an output standard of the display part 230, and the decoded audio signal may be output to the speaker 240.

The display part 230 may include a display panel displaying an image and a panel driver for controlling driving of the display panel.

The user input part 250 may receive a signal transferred by the host system HOST. The user input part 250 may be provided so that data related to the user's selection and input of a command related to communication with other display device, as well as data related to a selection of a channel transferred by the host system HOST, and a selection and manipulation of UI (User Interface) menu, may be input.

The HDD 260 may store various software programs including OS programs, recorded broadcast programs, motion images, photos, and other data, and may be formed of a storage medium such as a hard disk or non-volatile memory.

The network communication part 270 may be for short-distance communication with the host system HOST and other display devices, and may be implemented as a communication module including an antenna pattern that may implement mobile communication, data communication, a Bluetooth, an RF, an ethernet, or the like.

The network communication part 270 may transfer and receive a wireless signal with at least one of a base station, an external terminal, and a server through an antenna pattern to be described below in a mobile communication network constructed according to technical standards or communication methods for mobile communication (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, or the like).

The network communication part 270 may transfer and receive a wireless signal in a communication network according to wireless Internet technologies through an antenna pattern to be described below. Wireless Internet technology may include, for example, Wireless LAN (WLAN), Wireless-Fidelity (Wi-Fi), Wireless Fidelity (Wi-Fi) Direct, Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), Long Term Evolution (LTE), Long Term Evolution-Advanced (LTE-A), or the like, and the antenna pattern may transfer and receive data according to at least one wireless Internet technology within a range including Internet technologies not listed above.

The UI generating part 280 may generate a UI menu for communication with the host system HOST and other display devices, and may be implemented by an algorithm code and an OSD IC. The UI menu for communication with the host system HOST and other display devices DV2 to DV4 may be a menu for designating a counterpart digital TV for communication and selecting a desired function.

The control part 290 may be in charge of overall control of the first display device 11 and be in charge of communication control of the host system HOST and the second to fourth display devices 12, 13, and 14, and may be implemented by a Micro Controller Unit (MCU) in which corresponding algorithm code for control is stored and the stored algorithm code is executed.

The control part 290 may control to transfer corresponding control commands and data to the host system HOST and the second to fourth display devices 12, 13, and 14 through the network communication part 270 according to the input and selection of the user input part 250. Of course, when control commands and data are input from the host system HOST and the second to fourth display devices 12, 13, and 14, an operation may be performed according to the corresponding control commands.

Since a block diagram of the second display device 12, a block diagram of the third display device 13, and a block diagram of the fourth display device 14 are substantially a same as the block diagram of the first display device 11 described with reference to FIG. 10, descriptions thereof will be omitted.

Hereinafter, the light emitting element LE according to the embodiment will be described with reference to FIGS. 11 to 13. Contents that may be repetitive with respect to the above will be simplified or omitted. For convenience of description, in case of referring to an object, even in case that the object is indicated as a single number, embodiments having objects may be included.

Figure 11:
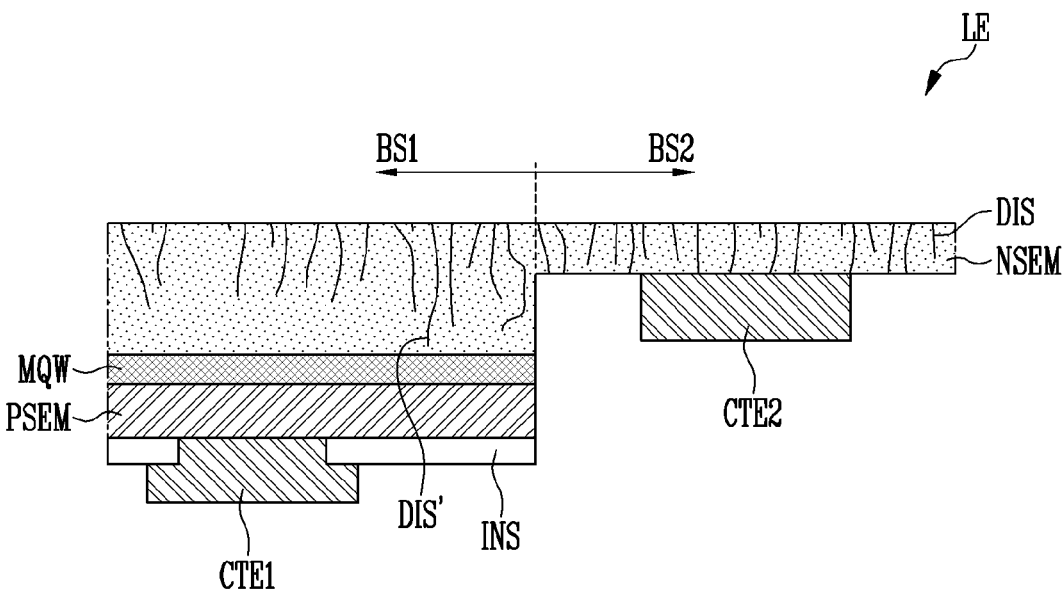
FIG. 11 is a schematic cross-sectional view illustrating a light emitting element according to an embodiment.

FIG. 11 is a schematic cross-sectional view illustrating a light emitting element according to an embodiment. FIG. 12 is a schematic plan view illustrating a light emitting element according to an embodiment. FIG. 13 is a schematic cross-sectional view illustrating a light emitting element according to an embodiment. For convenience of description, FIG. 13 is a drawing for illustrating a structure for emitting light according to an embodiment, and FIG. 13 schematically illustrates a stacked structure of the light emitting element LE. According to an embodiment, an embodiment in which the light emitting element LE is a flip-chip type micro LED is illustrated in FIGS. 11 to 13.

Figure 12:
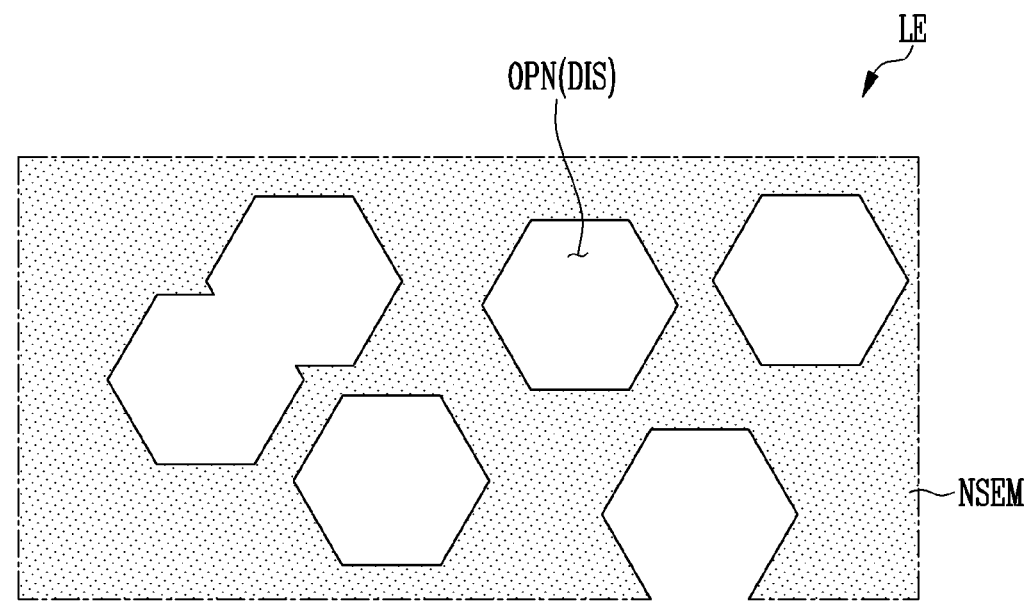
FIG. 12 is a schematic plan view illustrating a light emitting element according to an embodiment.
Figure 13:
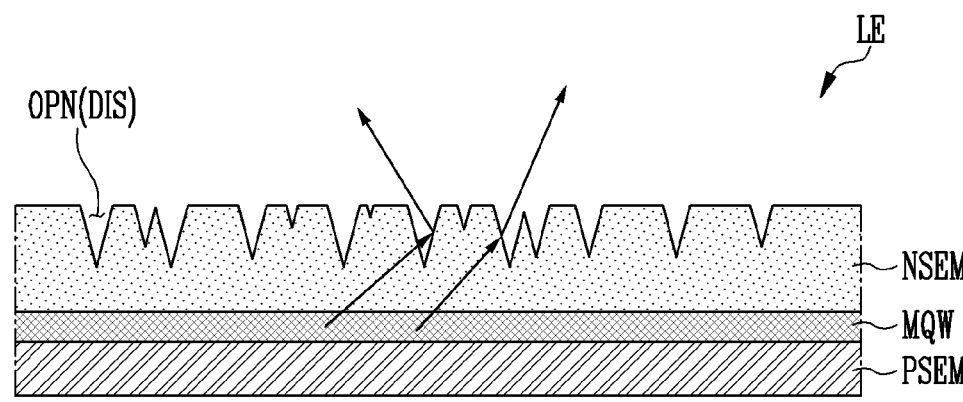
FIG. 13 is a schematic cross-sectional view illustrating a light emitting element according to an embodiment.

Referring to FIGS. 11 to 13, an n-type semiconductor NSEM may include a first base part BS1 and a second base part BS2. According to embodiments, an active layer MQW, a p-type semiconductor PSEM, a first contact electrode CTE1, and an element insulating layer INS may be disposed on the first base part BS1 of the n-type semiconductor NSEM. According to embodiments, the element insulating layer INS may be omitted. A second contact electrode CTE2 may be disposed on the second base part BS2 of the n-type semiconductor NSEM.

A thickness of the first base part BS1 may be thicker than a thickness of the second base part BS2. However, the disclosure is not necessarily limited to the above-described embodiment, and the thickness of the first base part BS1 and the thickness of the second base part BS2 may be substantially the same.

According to embodiments, the element insulating layer INS may be disposed on the p-type semiconductor PSEM, and may form an opening in which the first contact electrode CTE1 is disposed. Accordingly, the first contact electrode CTE1 may be electrically connected to the p-type semiconductor PSEM through the opening.

The n-type semiconductor NSEM may have a structure including a threading dislocation DIS. Threading dislocations DIS may be provided. The threading dislocation DIS may be formed in the n-type semiconductor NSEM. The threading dislocation DIS may be formed (or provided) by applying a strain due to a lattice-mismatch between a stacked substrate 1000 (see, e.g., FIG. 14) and the semiconductor layers in the process of epitaxially growing semiconductor layers (e.g., the first base semiconductor layer 1400 and the second base semiconductor layer 1800) on the stacked substrate 1000 (see, e.g., FIG. 14).

The threading dislocation DIS may extend toward a surface of the n-type semiconductor NSEM. For example, each of the threading dislocations DIS may face an outer surface of the n-type semiconductor NSEM. According to embodiments, the outer surface of the n-type semiconductor NSEM may mean a surface on which the active layer MQW is not disposed.

The threading dislocation DIS may not be substantially formed in the active layer MQW and the p-type semiconductor PSEM. The threading dislocation DIS may not be included in the active layer MQW and the p-type semiconductor PSEM. An amount of the threading dislocation DIS formed in the active layer MQW and the p-type semiconductor PSEM may be minimized. For example, the threading dislocation DIS may be provided in the structure of the n-type semiconductor NSEM without being disposed in the active layer MQW and the p-type semiconductor PSEM. According to embodiments, the longest threading dislocation DIS' having the longest (or most extended) length among the threading dislocations DIS may be smaller than the thickness of the n-type semiconductor NSEM (or the first base part BS1 of the n-type semiconductor NSEM). The threading dislocations DIS may include the longest threading dislocation DIS'. Here, the length of the longest threading dislocation DIS' may mean a length with respect to on the thickness direction of the n-type semiconductor NSEM.

According to embodiments, an occurrence of defects that may be formed in the active layer MQW and the p-type semiconductor PSEM due to the threading dislocation DIS may be substantially prevented (or minimized). Accordingly, a luminous efficiency of the light emitting element LE may be improved, and a quality of the light emitting element LE may be improved.

During a process for manufacturing the light emitting element LE, the lattice-mismatch to the active layer MQW and the p-type semiconductor PSEM may be minimized, so that the threading dislocation DIS may be prevented from being formed in the active layer MQW and the p-type semiconductor PSEM. Details thereon will be described below.

The threading dislocation DIS may form an opening OPN through which light may be emitted. For example, referring to FIGS. 12 and 13, the opening OPN may be provided in the n-type semiconductor NSEM based on the threading dislocations DIS. For example, the opening OPN may be based on the shape of the threading dislocation DIS. An end of at least one of the threading dislocation DIS may be opened in the opening OPN.

The opening OPN formed by the threading dislocation DIS may have a shape in a plan view. According to embodiments, the openings OPN may overlap each other. For example, the opening OPN may have a hexagonal shape in a plan view. However, the disclosure is not necessarily limited to the above-described embodiments. For example, the opening OPN may have various polygonal shapes or shapes including curved surfaces in a plan view.

As the threading dislocation DIS forms the opening OPN, the n-type semiconductor NSEM may have a non-uniform surface. For example, the n-type semiconductor NSEM may include a concave area corresponding to the opening OPN and a flat area in which the opening OPN is not formed (or not corresponding to the opening OPN). Accordingly, the concave area and the flat area may be randomly arranged (or formed) on a surface of the n-type semiconductor NSEM.

According to an embodiment, light provided from the active layer MQW may pass through the n-type semiconductor NSEM and be emitted to an outside of the display device 10. Since the opening OPN is formed so that the n-type semiconductor NSEM has a non-uniform surface, loss of light provided from the active layer MQW may be substantially prevented. For example, since light provided from the active layer MQW is provided (or emitted) to an outside through the opening OPN, loss of light generated while passing through the n-type semiconductor NSEM may be substantially reduced. For example, in case that the opening OPN is formed at a high density on a surface of the n-type semiconductor NSEM, an improvement of the luminous efficiency of the light emitting element LE may be more effective. To this end, the surface of the n-type semiconductor NSEM may be defined with respect to a position where the threading dislocation DIS is formed at a high density in a manufacturing process of the light emitting element LE. Details thereon will be described below.

A manufacturing method of the light emitting element LE according to the embodiment will be described with reference to FIGS. 14 to 18. Contents that may be repetitive with respect to the above are simplified or omitted.

FIGS. 14 to 18 are schematic cross-sectional views for each process step illustrating a manufacturing method of a light emitting element according to an embodiment. FIGS. 14 to 18 illustrate a cross-sectional structure of the light emitting element LE at each stage of manufacture based on the structure of the light emitting element LE illustrated with reference to FIG. 11.

Figure 14:
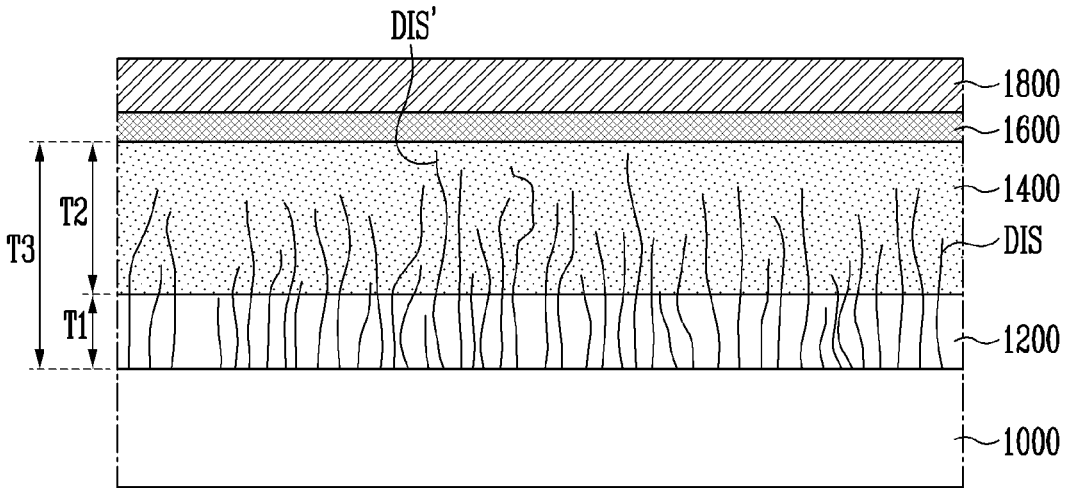
FIGS. 14 to 18 are schematic cross-sectional views for each process step illustrating a manufacturing method of a light emitting element according to an embodiment.

Referring to FIG. 14, a stacked substrate 1000 is prepared, and a buffer layer 1200, a first base semiconductor layer 1400, a base active layer 1600, and a second base semiconductor layer 1800 may be formed on the stacked substrate 1000. For example, in this step, an epitaxial growth process may be performed for forming the buffer layer 1200, the first base semiconductor layer 1400, the base active layer 1600, and the second base semiconductor layer 1800 on the stacked substrate 1000.

The stacked substrate 1000 may be a base plate for stacking a target material. The stacked substrate 1000 may be a wafer for epitaxial growth of a material (e.g., a predetermined or selectable material).

According to an embodiment, a hetero epitaxial growth method may be applied to a manufacturing method of the light emitting element LE. According to the hetero epitaxial growth method, the buffer layer 1200 may be disposed on the stacked substrate 1. A lattice constant of the buffer layer 1200 may be similar to a lattice constant of the first base semiconductor layer 1400, and accordingly, an occurrence of defects in the light emitting element LE may be substantially reduced.

According to an embodiment, the stacked substrate 1000 may include a substrate having an amorphous property or a polycrystalline property. For example, the stacked substrate 1000 may include a glass substrate or a silicon substrate.

According to an embodiment, since the stacked substrate 1000 has an amorphous property or a polycrystalline property, the epitaxial growth process may be performed on the stacked substrate 1000 having a large area. For example, the epitaxial growth of the manufacturing method of the light emitting element LE according to the embodiment may be suitable for being applied to the stacked substrate 1000 having the large area, so that the process performance may be excellent, and accordingly, the number of the light emitting elements LE that can be manufactured in a single process may be increased, and process costs may be substantially reduced.

The surface of the stacked substrate 1000 may be smooth. According to an embodiment, the shape of the stacked substrate 1000 may be a polygonal shape including a rectangle or a circular shape. However, the disclosure is not necessarily limited to the above-described embodiments.

As described above, the buffer layer 1200 may be interposed between the stacked substrate 1000 and the first base semiconductor layer 1400 to reduce the occurrence of defects in the light emitting element LE. The first base semiconductor layer 1400 may be a layer for forming the n-type semiconductor NSEM, and may include the n-type semiconductor material. The base active layer 1600 may be a layer for forming the active layer MQW, and may include a material having a single or multiple quantum well structure. The second base semiconductor layer 1800 may be a layer for forming the p-type semiconductor PSEM, and may include the p-type semiconductor material.

The buffer layer 1200, the first base semiconductor layer 1400, the base active layer 1600, and the second base semiconductor layer 1800 may be formed by at least one method selected from the group consisting of a metal organic chemical vapor deposition method (MOCVD), a molecular beam epitaxy method (MBE), a vapor phase epitaxy method (VPE), and a liquid phase epitaxy method (LPE). However, the disclosure is not necessarily limited to the above-described embodiments.

The buffer layer 1200 may include a material to have a lattice constant similar to that of the first base semiconductor layer 1400. For example, the buffer layer 1200 may include at least one selected from the group consisting of InAlGaN, GaN, AlGaN, InGaN, AlN, InN, GaAs, and the like. However, the disclosure is not necessarily limited to the above-described embodiments.

According to an embodiment, in the process of performing the epitaxial growth process, the threading dislocations DIS may be formed. According to an embodiment, the threading dislocations DIS may be formed on the stacked substrate 1000, and may be formed over the buffer layer 1200 and the first base semiconductor layer 1400. As described above, the threading dislocations DIS may generally extend in the thickness direction of the stacked substrate 1000 (or in a stacking direction of the first base semiconductor layer 1400, the base active layer 1600, and the second base semiconductor layer 1800).

According to an embodiment, a formation of the threading dislocations DIS in the active layer 1600 and the second base semiconductor layer 1800 may be substantially prevented. According to an embodiment, the threading dislocations DIS may not be formed in the active layer 1600 and the second base semiconductor layer 1800.

According to an embodiment, by controlling the thickness of each of the buffer layer 1200 and the first base semiconductor layer 1400, the formation positions of the threading dislocations DIS may be adjusted. For example, the buffer layer 1200 may have a first thickness T1 (e.g., a buffer thickness). The first base semiconductor layer 1400 may have a second thickness T2. The buffer layer 1200 and the first base semiconductor layer 1400 may have a third thickness T3 as a whole.

According to an embodiment, the third thickness T3 may be greater than a length (e.g., an extension length) of the longest threading dislocation DIS'. The length of the longest threading dislocation DIS' may be a length based on the thickness direction of the stacked substrate 1000. For example, the threading dislocations DIS may include the longest threading dislocations DIS' that is longest based on the thickness direction of the stacked substrate 1000. The threading dislocations DIS may not penetrate layers spaced apart from the first base semiconductor layer 1400 from the stacked substrate 1000, and accordingly, the formation of the threading dislocation DIS in the active layer MQW and the p-type semiconductor PSEM provided according to a subsequent process may be substantially prevented.

According to an embodiment, the first thickness T1 may be greater than or equal to about 80 nm. In another example, the first thickness T1 may be greater than or equal to about 100 nm. The first thickness T1 may be greater than or equal to about 150 nm. According to an embodiment, the first thickness T1 may be less than or equal to about 160 nm while satisfying one of the above-described numerical ranges. In another example, the first thickness T1 may be less than or equal to about 180 nm while satisfying one of the above-described numerical ranges. According to an embodiment, the second thickness T2 may be greater than or equal to about 2 μm. In another example, the second thickness T2 may be greater than or equal to about 3 μm. The second thickness T2 may be greater than or equal to about 5 μm. The second thickness T2 may be greater than or equal to about 6 μm. According to an embodiment, the second thickness T2 may be less than or equal to about 7 μm while satisfying one of the above-described numerical ranges. According to the embodiment, as described above, the first thickness T1 of the buffer layer 1200 and the second thickness T2 of the first base semiconductor layer 1400 may satisfy a numerical range (e.g., a predetermined or selectable numerical range), so that a sufficient thickness can be obtained. Accordingly, the threading dislocations DIS may be formed in the buffer layer 1200 and the first base semiconductor layer 1400 while minimizing the formation of the threading dislocations DIS on the base active layer 1600 and the second base semiconductor layer 1800. The formation of defects in the light emitting element LE (e.g., the active layer MQW and the p-type semiconductor PSEM) may be controlled, so that the light emitting performance of the light emitting element LE can be improved.

Figure 15:
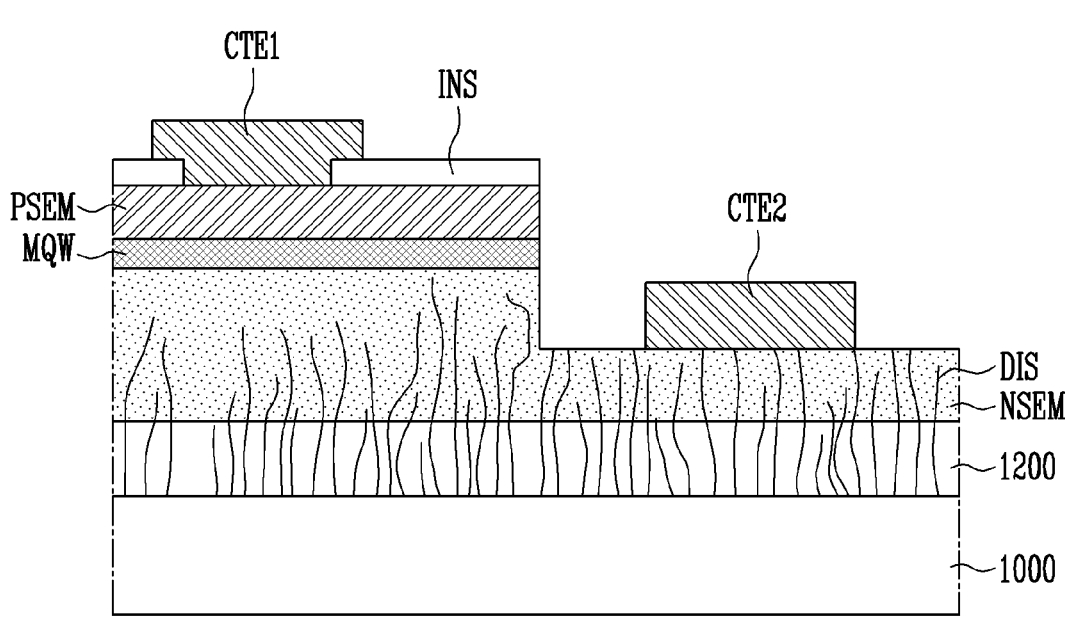

Referring to FIG. 15, the first base semiconductor layer 1400, the base active layer 1600, and the second base semiconductor layer 1800 may be patterned to provide the n-type semiconductor NSEM, the active layer MQW, and the p-type semiconductor PSEM.

According to an embodiment, an etching process may be performed on the first base semiconductor layer 1400, the base active layer 1600, and the second base semiconductor layer 1800. In order to form an individually patterned structure, a mask may be disposed on the first base semiconductor layer 1400, the base active layer 1600, and the second base semiconductor layer 1800, and an etching process may be performed. According to an embodiment, the etching process may be at least one of a reactive ion etching (ME), a reactive ion beam etching (RIBE), and an inductively coupled plasma reactive ion etching (ICP-RIE), but is not limited to a specific example.

In this step, the element insulating layer INS may be patterned (or formed) on the p-type semiconductor PSEM, and by forming the first contact electrode CTE1 in the opening(s) formed in the element insulating layer INS, the first contact electrode CTE1 and the p-type semiconductor PSEM may be electrically connected to each other. By forming the second contact electrode CTE2 on the n-type semiconductor NSEM, the n-type semiconductor NSEM and the second contact electrode CTE2 may be electrically connected to each other.

Figure 16:
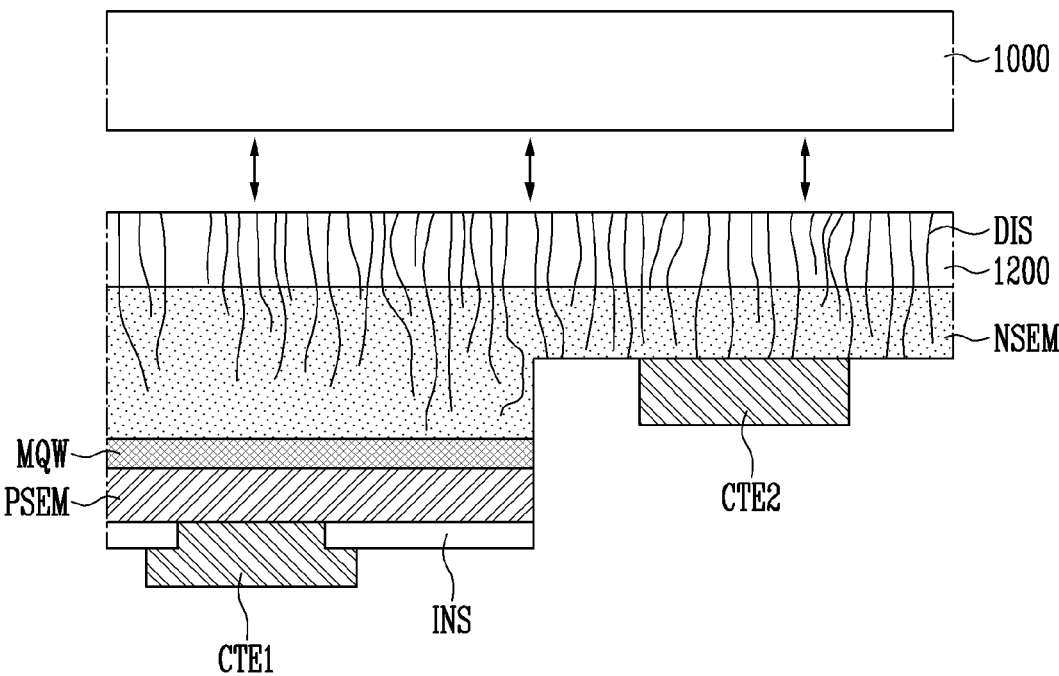

Referring to FIG. 16, the stacked substrate 1000 may be separated from the buffer layer 1200. According to an embodiment, the p-type semiconductor PSEM may be rotated to be disposed below the n-type semiconductor NSEM with respect to a direction of gravity. Accordingly, the p-type semiconductor PSEM may face downward, and the n-type semiconductor NSEM may face upward.

According to an embodiment, the stacked substrate 1000 and the buffer layer 1200 may be separated by a laser lift-off (LLO) method. However, the disclosure is not necessarily limited to the above-described embodiments.

Figure 17:
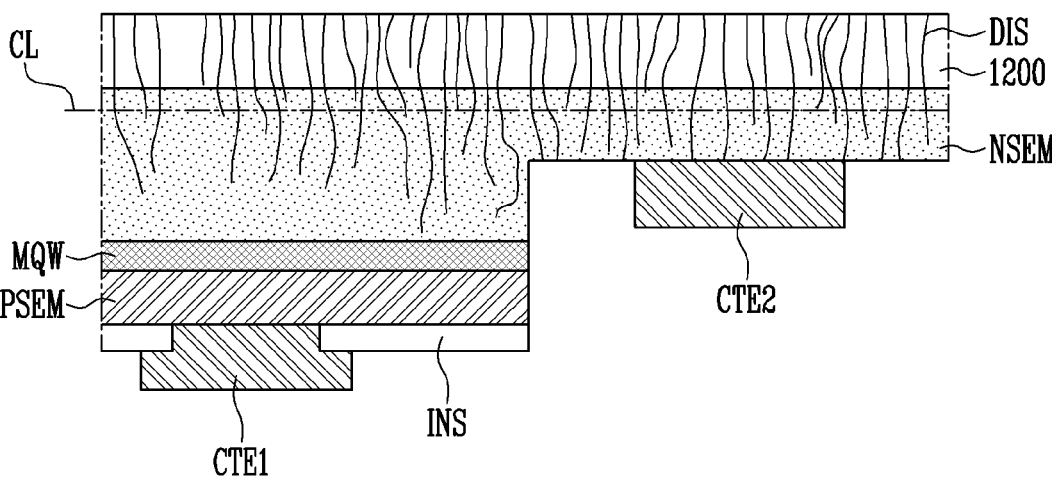

Referring to FIG. 17, a cutting line CL for cutting the n-type semiconductor NSEM may be set. The cutting line CL may be a virtual line defined in the n-type semiconductor NSEM.

The cutting line CL may be determined based on a density of the threading dislocation DIS. For example, the cutting line CL may be defined at a position having the highest density of the threading dislocations DIS for each position with respect to the thickness direction of the n-type semiconductor NSEM. The cutting line CL may extend in an extension direction (e.g., a horizontal direction with respect to FIG. 18) of the buffer layer 1200 while being defined at a position having the highest density of the threading dislocation DIS.

According to an embodiment, a portion of the n-type semiconductor NSEM may be cut, so that light loss may be further prevented. For example, light provided from the active layer MQW may pass through the n-type semiconductor NSEM and be emitted to an outside of the light emitting element LE. The intensity of light provided from the active layer MQW may be reduced while passing through the n-type semiconductor NSEM. However, since a portion of the n-type semiconductor NSEM is cut, light loss that may be generated while light passes through the n-type semiconductor NSEM may be substantially reduced.

According to an embodiment, a process (e.g., a laser lift-off method) in which the stacked substrate 1000 is separated may be performed, and an outer surface of the buffer layer 1200 may be damaged. For example, an oxide layer (e.g., soot, etc.) may be formed on a surface of the buffer layer 1200 from which the stacked substrate 1000 is separated, and in case that the oxide layer remains, it may be difficult for light emitted from the active layer MQW to be emitted to the outside. However, as described above, as a portion of the n-type semiconductor NSEM is cut based on the cutting line CL, the buffer layer 1200 may also be separated. Accordingly, the oxide layer may be removed, and light emitted from the active layer MQW may be effectively emitted to the outside.

According to the embodiment, the cutting line CL for cutting the n-type semiconductor NSEM may be set based on the density of the threading dislocation DIS, so that a non-uniform surface may be more predominantly formed on the outer surface after the n-type semiconductor NSEM is cut. For example, as described above with reference to FIGS. 11 to 13, a concave area because of the opening OPN and a flat area may be formed on a surface of the n-type semiconductor NSEM, and accordingly, a luminous efficiency of the light emitting element LE can be improved. The area of the concave area may be generally proportional to the number of openings OPN on a surface of the n-type semiconductor NSEM, and the number of openings OPN may be generally proportional to the number of the threading dislocations DIS adjacent to a surface of the n-type semiconductor NSEM. For example, as the number of the threading dislocations DIS adjacent to a surface of the n-type semiconductor NSEM increases, an area of the concave area on a surface of the n-type semiconductor NSEM increases, so that the efficiency of the light emitting element LE can be further improved. As a result, since the cutting line CL is defined at the position of the threading dislocation DIS having the high-density, the luminous efficiency of the light emitting element LE may be more effectively improved.

Referring to FIG. 18, the n-type semiconductor NSEM may be cut based on the cutting line CL, and the light emitting element LE according to the embodiment may be provided (or manufactured).

The n-type semiconductor NSEM may be cut to expose a surface of the n-type semiconductor NSEM. A portion (or an end) of the threading dislocation DIS may be opened to form the openings OPN, and thus a surface of the n-type semiconductor NSEM may have a non-uniform surface. As described above, as a surface of the n-type semiconductor NSEM has a non-uniform surface, it goes without saying that the luminous efficiency of the light emitting element LE is improved.

According to an embodiment, the n-type semiconductor NSEM may be cut by a dry etching process. However, the disclosure is not necessarily limited to the above-described embodiments.

Although not shown separately in the drawing, the display device 10 according to the embodiment may be provided by disposing the manufactured light emitting element LE on the substrate SUB (e.g., on the thin film transistor layer TFTL). For example, the light emitting element LE may be provided on the common electrode CE and may be electrically connected to the thin film transistor TFT.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A light emitting element comprising:
an n-type semiconductor;
a p-type semiconductor; and
an active layer between the n-type semiconductor and the p-type semiconductor, wherein
threading dislocations are formed in the n-type semiconductor, and
openings are formed on a surface of the n-type semiconductor based on the threading dislocations,
wherein the threading dislocations extend toward a side of the n-type semiconductor on which the active layer is not disposed,
the threading dislocations include a longest threading dislocation having a longest length with respect to a thickness direction of the n-type semiconductor, and
a length of the longest threading dislocation is less than a thickness of the n-type semiconductor.

2. The light emitting element of claim 1, wherein an end of at least one of the threading dislocations is opened in the openings.

3. The light emitting element of claim 1, wherein
the n-type semiconductor includes:
a concave area corresponding to the openings; and
a flat area not corresponding to the openings, and
the concave area and the flat area are randomly formed on the surface of the n-type semiconductor.

4. The light emitting element of claim 1, wherein the openings have a polygonal shape or a shape including a curved surface in a plan view.

5. The light emitting element of claim 1, wherein the threading dislocations are not included in the active layer and the p-type semiconductor.

6. The light emitting element of claim 1, wherein at least a portion of light provided from the active layer is emitted through the openings to prevent a decrease in an intensity of the light.

7. The light emitting element of claim 1, further comprising a first contact electrode electrically connected to the p-type semiconductor and a second contact electrode electrically connected to the n-type semiconductor, wherein
the n-type semiconductor includes a first base part and a second base part,
the active layer, the p-type semiconductor, and the first contact electrode are disposed on the first base part, and
the second contact electrode is disposed on the second base part.

8. The light emitting element of claim 7, wherein the light emitting element is a flip chip type micro LED.

9. An electronic device comprising a light emitting element disposed on a substrate and including:
an n-type semiconductor;
a p-type semiconductor; and
an active layer interposed between the n-type semiconductor and the p-type semiconductor, wherein
threading dislocations are formed in the n-type semiconductor; and
openings are formed on a surface of the n-type semiconductor based on the threading dislocations,
wherein the threading dislocations include a longest threading dislocation having a longest length with respect to a thickness direction of the n-type semiconductor, and
wherein a length of the longest threading dislocation is less than a thickness of the n-type semiconductor.

10. A tile type display device comprising:

display devices adjacent to each other, and a joint connecting the display devices, wherein each of the display devices includes:

a light emitting element disposed on a substrate and including:

an n-type semiconductor;

a p-type semiconductor; and an active layer between the n-type semiconductor and the p-type semiconductor, threading dislocations are formed in the n-type semiconductor, and openings are formed on a surface of the n-type semiconductor based on the threading dislocations, wherein the threading dislocations extend toward a side of the n-type semiconductor on which the active layer is not disposed, and wherein the light emitting element is a flip chip type micro LED.

\* \* \* \* \*